US 9,960,732 B2

(12) United States Patent
Höft

(10) Patent No.: US 9,960,732 B2
(45) Date of Patent: May 1, 2018

(54) SAFE PHOTOVOLTAIC SYSTEM

(71) Applicant: Phoenix Contact GmbH & Co. KG, Blomberg (DE)

(72) Inventor: Wolfgang Höft, Barntrup (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 284 days.

(21) Appl. No.: 14/766,516

(22) PCT Filed: Feb. 11, 2014

(86) PCT No.: PCT/EP2014/052666
§ 371 (c)(1),
(2) Date: Aug. 7, 2015

(87) PCT Pub. No.: WO2014/122327
PCT Pub. Date: Aug. 14, 2014

(65) Prior Publication Data
US 2016/0006392 A1 Jan. 7, 2016

(30) Foreign Application Priority Data
Feb. 11, 2013 (DE) .................. 10 2013 101 314

(51) Int. Cl.
| H02H 1/04 | (2006.01) |
| H02H 3/04 | (2006.01) |
| H02M 1/32 | (2007.01) |
| H02S 50/10 | (2014.01) |
| H02H 7/20 | (2006.01) |
| H02H 11/00 | (2006.01) |
| H02S 40/34 | (2014.01) |
| H02H 7/26 | (2006.01) |

(Continued)

(52) U.S. Cl.
CPC ............... *H02S 50/10* (2014.12); *H02H 3/08* (2013.01); *H02H 3/20* (2013.01); *H02H 7/20* (2013.01); *H02H 7/268* (2013.01); *H02H 11/00* (2013.01); *H02S 40/34* (2014.12); *H02S 50/00* (2013.01)

(58) Field of Classification Search
CPC ........... H02S 50/00; H02S 50/10; H02H 3/08; H02H 3/20; H02H 1/04; H02H 3/04; H02M 1/32
USPC ......................................................... 361/78
See application file for complete search history.

(56) References Cited

U.S. PATENT DOCUMENTS

| 6,650,031 B1 | 11/2003 | Goldack |
| 7,772,716 B2 | 8/2010 | Shaver, II et al. |

(Continued)

FOREIGN PATENT DOCUMENTS

| AU | 2012225199 A1 | 10/2013 |
| CN | 101951190 A | 1/2011 |

(Continued)

OTHER PUBLICATIONS

German Office Action, Applicant: Phoenix Contact GmbH & Co. KG, Serial No. 10 2011 110 682.4, dated Apr. 22, 2014.

(Continued)

*Primary Examiner* — Dharti Patel
(74) *Attorney, Agent, or Firm* — Reising Ethington P.C.

(57) ABSTRACT

A fault detection system in a photovoltaic system 1, is able to identify a system state on the basis of a first and optionally a second measured data profile and is thus able to distinguish error states from the operating state of the system.

27 Claims, 13 Drawing Sheets

(51) Int. Cl.
*H02S 50/00* (2014.01)
*H02H 3/08* (2006.01)
*H02H 3/20* (2006.01)

(56) References Cited

U.S. PATENT DOCUMENTS

| | | | |
|---|---|---|---|
| 8,809,699 | B2 | 8/2014 | Funk |
| 8,859,884 | B2 | 10/2014 | Dunton et al. |
| 8,963,375 | B2 | 2/2015 | DeGraaff |
| 2009/0014057 | A1 | 1/2009 | Croft et al. |
| 2009/0207543 | A1 | 8/2009 | Boniface et al. |
| 2010/0043870 | A1 | 2/2010 | Bennett et al. |
| 2010/0139734 | A1 | 6/2010 | Hadar et al. |
| 2010/0241375 | A1 | 9/2010 | Kumar et al. |
| 2010/0300508 | A1 | 12/2010 | Maier et al. |
| 2010/0317782 | A1 | 12/2010 | Hattori et al. |
| 2010/0321148 | A1 | 12/2010 | Gevorkian |
| 2011/0172842 | A1 | 7/2011 | Makhota et al. |
| 2012/0050924 | A1* | 3/2012 | Matsuo ............. H01L 31/02021 361/42 |
| 2012/0194003 | A1 | 8/2012 | Schmidt et al. |
| 2014/0137920 | A1 | 5/2014 | Berg |
| 2014/0301003 | A1 | 10/2014 | Jankowski |
| 2014/0311549 | A1 | 10/2014 | Kruse et al. |
| 2016/0006392 | A1 | 1/2016 | Hoft |

FOREIGN PATENT DOCUMENTS

| | | |
|---|---|---|
| CN | 201918923 U | 8/2011 |
| CN | 201927619 U | 8/2011 |
| CN | 102598287 A | 7/2012 |
| DE | 19844977 A1 | 4/2000 |
| DE | 102007037130 B3 | 4/2009 |
| DE | 102009051186 | 5/2010 |
| DE | 102009022569 A1 | 12/2010 |
| DE | 102010023549 | 12/2011 |
| DE | 102010054354 A1 | 6/2012 |
| DE | 102011079074 A1 | 1/2013 |
| DE | 102011107365 | 1/2013 |
| DE | 102013101314 A1 | 8/2014 |
| EP | 2256819 A1 | 12/2010 |
| JP | 2006278755 A | 10/2006 |
| WO | 2009073868 | 6/2009 |
| WO | 2010078303 | 7/2010 |
| WO | 2011023732 A2 | 3/2011 |
| WO | 2012079742 A1 | 6/2012 |
| WO | 2013000762 A2 | 1/2013 |
| WO | 2013007638 A2 | 1/2013 |
| WO | 2013010083 | 1/2013 |
| WO | 2013010083 A2 | 1/2013 |

OTHER PUBLICATIONS

Office Action, U.S. Appl. No. 14/239,285, filed April 11, 2014, First Named Inventor: Martin Jankowski, dated Dec. 31, 2015.
Moser Taboada Attorneys at Law Letter, dated Jul. 7, 2015, Re: U.S. Appl. No. 14/239,285, Entitled: Socket for a Solar Panel with a Protective Circuit.
International Search Report and Written Opinion, Int. Serial No. PCT/EP2012/003459, Int. Filing Date: Aug. 14, 2012, Applicant Name: Phoenix Contact GmbH & Co. KG, dated Dec. 21, 2012.
Chinese Office Action, Application No. 201480019926.3, Applicant: Phoenix Contact GmbH & Co. KG, Title: Safe Photovoltaic System, dated Jun. 3, 2016.
PTO Search Report and Written Opinion, Int. Serial No. PCT/EP2014/052663, Int. Filing Date: Feb. 11, 2015, Applicant: Phoenix Contact GmbH & Co. KG, dated May 26, 2014.
China Office Action, Application No. 201280040488.X, Applicant: Phoenix Contact GmbH & Co. KG, Title: Socket for a Solar Panel with a Protective Circuit, dated Aug. 5, 2015.
Search result from the German Patent and Trademark Office, dated Nov. 18, 2014.
German Office Action, Applicant: Phoenix Contact GmbH & Co. KG, Serial No. 10 2015 114 755.6, dated May 20, 2016.
Chinese Office Action, Application No. 201480019920.6, Applicant: Phoenix Contact GmbH & Co. KG, Title: Safe Photovoltaic System, dated Mar. 3, 2017.
International Search Report and Written Opinion, Int. Serial No. PCT/EP2014/052666, Int. Filing Date: Feb. 11, 2014, Applicant: Phoenix Contact GmbH & Co. KG, dated May 15, 2014.
German Office Action, Serial No. 10 2013 101 314.7, Applicant: Phoenix Contact GmbH & Co. KG, dated Dec. 20, 2013.
English Translation of the International Preliminary Examination Report, Int. Application No: PCT/EP2014/052666, Int. Filing Date: Feb. 11, 2014, Applicant: Phoenix Contact GmbH & Co., dated Aug. 11, 2015.

* cited by examiner

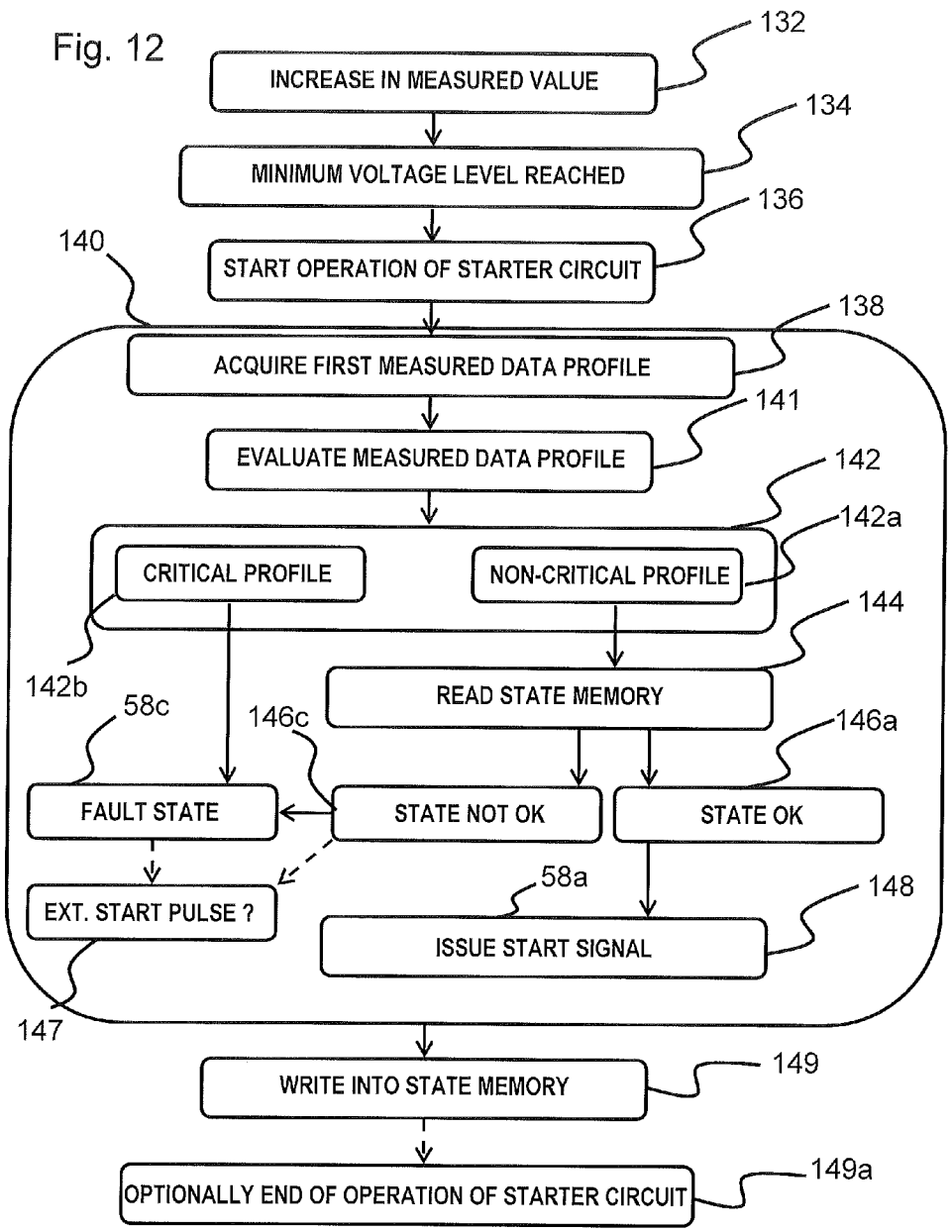

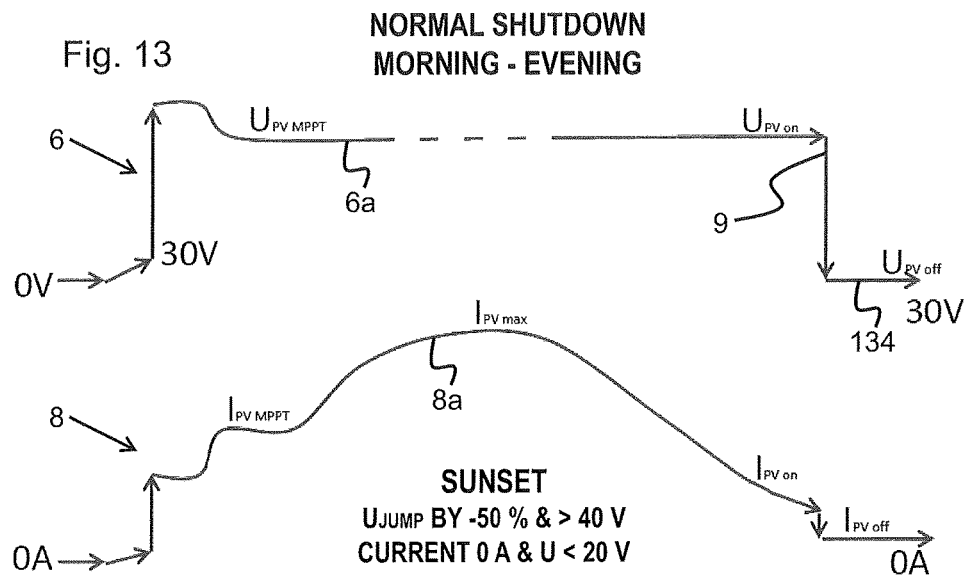
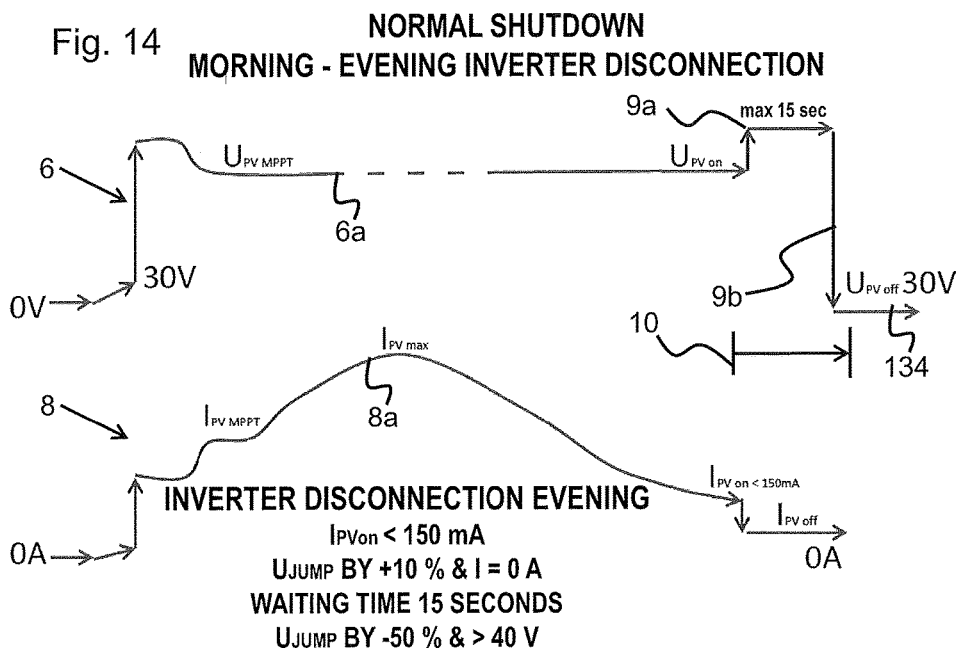

START PULSE

SAFE PHOTOVOLTAIC SYSTEM

TECHNICAL FIELD

The present disclosure relates to a method for detecting an electrical fault in a photovoltaic system, and further relates to a photovoltaic system comprising at least one string of series-connected solar modules and a system for individually disconnecting solar modules and for safely reconnecting the disconnected solar modules to the string.

BACKGROUND

Hitherto, solar systems often have not been equipped with special safety provisions. The solar connection box (also known as solar junction box) provided on each solar module is essentially used to accommodate the mechanical connections of the conductive strips (also known as conductor ribbons) of the solar module and the bypass diodes thereof. Such simple solar modules will supply voltage as soon as they are illuminated.

Typically, the solar modules are series-connected so as to form strings in order to obtain a high string voltage. This voltage of the solar modules connected into strings can amount to several 100 V, and in large systems voltages of about 1000 V or even more may be present, which is a hazardous voltages when being touched. Also, a solar power system optionally comprises a plurality of strings connected in parallel.

Thus, in case of adequate illumination very high voltages might be generated during the installation of solar modules and when electrically connecting them in the string, so that cautious handling and a special contact protection is required. The same applies to maintenance works.

In such simple photovoltaic systems the first possibility for disconnecting the solar generator voltage from the power grid is at the string combiner box. Therefore, in case of damage caused by fire, water, hail or in case of other malfunctions of the solar modules or the string lines there is no way for these simple solar systems to disconnect the part of the photovoltaic system that includes the solar modules and the string lines from voltage.

Safety devices for switching off the individual solar modules in case of fire or faults are known (e.g. DE 10 2009 024 516 A1). However, such solutions are usually only intended for a single emergency switching off.

DE 10 2011 110 682 discloses a junction box which switches from the operating state to a safe state in case of a deviation of the allowed parameters.

As an enhancement of the invention described in DE 10 2011 110 682, the present disclosure relates in particular to a safe shutdown and restart of the photovoltaic system on the condition that the photovoltaic system is able to distinguish between a "real fault" on the one hand and "normal system operation" on the other.

SUMMARY

Therefore, it is an object of the present disclosure to provide a photovoltaic system which meets high safety requirements and which in particular provides for safe disconnection or deactivation in the event of a fault and for controlled initial connection or starting after installation, and reconnection or restarting, for example after faults, maintenance work, or at sunrise.

Another aspect of the object is to detect faults, especially electrical faults, and to distinguish them from the operating state.

Other objects will become apparent from the following description and the specific advantages obtained with specific embodiments.

The object is achieved by the subject matter of the independent claims. Various other embodiments are specified in the dependent claims.

The method according to the present disclosure for detecting an electrical fault in a photovoltaic system, in particular in a string of the photovoltaic system comprises the following steps: First, a first measured data profile of a first electrical parameter in the photovoltaic system is measured. In particular, the first electrical parameter is a system voltage or a string voltage. For the measurement a measuring device is for instance provided which may be connected to the string.

In a further step, the first measured data profile is evaluated. To this end, several values of the parameter are sampled over time, and digital data are generated from the obtained measured values which are stored in chronological order. Preferably it is possible to only record or take into account at least two such measured parameters.

Particularly preferably, the first electrical parameter is sampled at a specific sample rate and the obtained data are stored. In this manner, a measured data profile is acquired which reflects the change of the electrical parameter over time. Preferably, the measured data profile may be stored for a duration of greater than 1 second, more preferably greater than 9 seconds. The measured data profile is now evaluated with respect to characteristic changes of the measured values, for example using an evaluation means. For example, in the simplest case of operation a string voltage is sensed which does not change substantially in the course of one day during a period from just after sunrise until just before sunset, i.e. remains substantially constant.

In a further step, a system state is identified based on the first measured data profile. For this purpose, predefined data profiles may be stored for instance in a comparison memory, which are compared with the currently measured data profile.

If the measured data profile essentially corresponds to a data profile which is for instance typical or characteristic for an operating condition of the system, the state of the system is identified as normal or within the operating state. On the other hand, if the measured data profile essentially corresponds to a data profile which is typical or characteristic for a fault of the photovoltaic system or of the string, the state of the system is identified as an error state.

The identified system state is eventually stored in a state memory, so that it is available to identify the current state of the system. In other words, the state memory can now be read out by other systems of the photovoltaic system, for example by "smart solar modules" that will be described in more detail below, to find out the system state.

The system state may preferably assume at least two predefined states, namely an operating state or an error state. The operating state corresponds to a state of the system which exists during normal operation. In other words, the present method permits to identify whether the system is in the operating state based on a measured data profile and possibly a comparison with a stored predefined data profile. It is now also possible for the normal shutdown at night to be associated with the operating state and to be stored in the state memory. For example, the "smart solar modules" mentioned may retrieve the system state during restart in the morning and may connect the respective solar module to the power grid in response to the system state.

Preferably, a second measured data profile of a second electrical parameter of the photovoltaic system, in particular of the string of the photovoltaic system, is measured. In particular, the second electrical parameter is a system current or a string current. In this case, the first and the second measured data profiles are evaluated synchronously. The system state can now be identified based on a combination of the evaluation results of the first and second measured data profiles. In other words, based on the time course of for instance the string voltage and string current, the system state in the respective string of the system can be identified and the states 'operating state' or 'error state' can be set accordingly.

In a further embodiment of the present disclosure, the first measured data profile is raised to a minimum voltage level greater than zero. Preferably, the minimum voltage level is more than 20 volts, more preferably between 20 and 40 volts. In a simple embodiment, a power supply unit may feed a minimum voltage into the string of the photovoltaic system, for example, so that a minimum voltage of an appropriate level will be present in the string.

Preferably, the photovoltaic system comprises at least one inverter, also referred to as a.c. converter, for generating an a.c. voltage from the d.c. voltage of the photovoltaic system, in particular in order to feed the power output of the photovoltaic system into a public power grid. Particularly preferably, the evaluating of the measured data profile is performed below a minimum operating voltage of the inverter. The minimum operating voltage of the inverter is for instance a voltage level in the photovoltaic system or in the string of the photovoltaic system below which the inverter stops operating. In other words, an inverter will typically switch off as soon as the voltage in the photovoltaic system or in the string of the photovoltaic system falls below a predefined minimum operating voltage. The minimum operating voltage is typically a parameter predefined by the manufacturer of the inverter, which is often in a range between 110 and 130 volts.

According to a preferred embodiment, the start box may output an enable signal for solar modules of the photovoltaic system in response to the system state. To this end, the start box retrieves the system state from the state memory and, for example, only outputs an enable signal when the system state stored is the operating state. In other words, during the operating state the start box continuously issues an enable signal, whereas the start box does not issue an enable signal during an error state.

Solar modules of the photovoltaic system may furthermore have associated therewith a safety circuit which enables the associated solar module in response to the system state. That means, the solar module associated with the safety circuit is in particular enabled when the enable signal is detected, and on the other hand it will be electrically disconnected when no enable signal is detected.

In addition to the operating state and the error state, the system may optionally assume a safe state as a third predefined state. For example in case of a normal shutdown in twilight or at general darkness, the evaluation means will identify the normal measured data profile which occurs in such a situation and will set the safe state in the state memory. This is particularly interesting when the operating voltage in the solar system falls below the minimum operating voltage of the inverter, but the solar modules still supply power, though it might be low. In this case, the solar modules may be disconnected, because in any case the output power is no longer processed by the inverter(s). According to the present disclosure, normal shutdown of the inverter below the minimum operating voltage or a disconnection of solar modules can be detected, and that such measured data profile will not lead to an error entry in the state memory. Rather, in case of such a measured data profile that is attributable to normal operation, the solar system may resume normal operation the next morning, for example. This is of particular interest for the system operator who expects the least possible downtime of the system. On the other hand, safety can be increased if the solar modules can be automatically disconnected when the inverter(s) or the solar modules ordinarily stop operation, for example at night.

Preferably, the start box will no longer output an enable signal to the solar modules when the system state has assumed the safe state. In other words, by reading out the state memory, the start box will detect the safe state and will therefore stop issuing the enable signal in response to that system state.

Possibly, a differentiation has to be made between system state on the one hand and state of the safety circuit on the other. For the safety circuit it has generally proven favorable to only provide the states "on" and "off"—corresponding to the operating state (on) and the safe state (off). The switching command or the information about which state is to be assumed is provided by the starter circuit which provides, or not, the starting current or start signal, preferably by taking into account the system state. Particularly preferably, the starter circuit provides the starting current or start signal only in the operating state, but not in an error state or in the safe state of the system. To explain it clearly once more: in the manner described above the safety circuit does not need the "error state" but only the operating state and the safe state. However, it is preferable in this embodiment if the starter circuit distinguishes all three states—the operating state, the safe state, and the error state—and processes them as described above. In a very simple case the difference between safe state and error state will then be that when coming from the safe state the starter circuit will allow a restart of the solar system and a reconnection of the solar modules under appropriate conditions (e.g. existing sunlight) and will issue the start signal or starting current, but not in an error state, so that in the error state the solar system will remain essentially de-energized, i.e. without voltage, even if in principle the solar system could supply power. The fact that in this embodiment the safety circuits only enable the solar system and the solar modules to supply power when the start signal or starting current is detected, leads to an increase in system safety and may possibly even be described as a "failsafe" principle.

The state memory may have a write protection, so that the state memory can no longer be written once the error state is stored in the state memory. In other words, the system states 'operating state' and 'safe state' can no longer be written once the system state 'error state' is stored in the state memory. This ensures that the error state once detected is not overwritten during normal operation as soon as the measured data profile for instance incidentally reassumes the characteristic of the operating state. Rather, the solar system or the string will remain in the error state in which the solar system or the string is disconnected from voltage until the state memory is reset or deleted, in particular by skilled personnel.

A photovoltaic system according to the present disclosure comprises at least one string of series-connected solar modules for generating electric power from solar energy. Of course, a plurality of strings may be provided and may be connected in parallel. The plurality of solar modules each comprise a connection box (also referred to as (solar) junction box) by means of which the solar modules are electrically connected to the string.

The solar junction box is typically mounted to the associated solar module on the rear side of the associated solar module, for example glued thereto, and comprises input-side positive and negative connection elements, typically in form of contact terminals, by means of which the voltage-carrying conductor strips (also referred to as ribbons) of the positive and negative poles of the associated solar module, which extend from the surface of the solar module are electrically connected in the solar junction box. The solar junction boxes provide a connection between the string lines and the voltage-carrying conductor ribbons of the associated solar module. Therefore, the solar junction boxes further comprise output-side positive and negative connection elements which are electrically connected to the respective input-side connection element inside the solar junction box. The string line is composed of connecting cables which connect the solar modules of the string in series and which are connected to the positive and negative connection elements of the solar junction boxes for this purpose. Depending on the embodiment, the connecting cables are electrically connected within the solar junction box, or the output-side positive and negative connection elements are provided in form of plug-in connectors and the connecting cables have plug-in connectors mateable therewith so that the connecting cables can be plugged into the solar junction box on site. Accordingly, the solar modules are connected in series to form the string by means of the string line connected to the output-side positive and negative connection elements. In this way, the string line forms an electrical circuit comprising the series-connected solar modules and an inverter.

The photovoltaic system further includes a measuring device for measuring a first data profile of a first electrical parameter in the photovoltaic system, in particular of the string. In other words, an electrical parameter is measured, in particular sampled and digitized, by the measuring device. For measuring the data or parameter profile, the measuring device comprises for instance a voltage sensor for measuring a system voltage or a string voltage.

An evaluation means is provided for evaluating the first measured data profile and for identifying a system state based on the first measured data profile. In other words, the first measured data profile is for instance compared with predefined data or parameter profiles stored in the comparison memory in order to identify the system state from a comparison of the measured data profile with the stored predefined data profile(s). The system state may for example take three predefined states, namely the operating state, error state, and safe state.

As a result of the comparison of data profiles or the evaluating of the measured data profile the system state is obtained and is stored in a state memory.

The state memory may be a flash memory which retains the stored system state even in the event of power supply failure. This provides increased safety in the event of an electrical failure. Moreover preferably, the state memory is powered by the solar system with the necessary electric power. Thus, the system state will as well remain stored upon a normal shutdown of the solar system when it is getting dark in this case.

The evaluation means may comprise a microcontroller which performs arithmetic operations to determine the system state. For the case that the currently measured data profile is compared with stored predefined data profiles, many arithmetic operations might have to be carried out in order to ensure a reliable identification of the system state.

The comparison memory is preferably associated with the microcontroller. The comparison memory may hold predefined data profiles for the operating state and the error state, optionally also for the safe state. The microcontroller may then compare the measured data profiles with the predefined data profiles and may identify the system state based thereon, possibly using the arithmetic operations.

The measuring device may further be adapted for measuring a second data profile of a second electrical parameter of the photovoltaic system, in particular of the string of the photovoltaic system. For example, it may be desirable to simultaneously measure string voltage and string current, or to simultaneously measure system voltage and system current.

In this embodiment, the evaluation means is further adapted for synchronously evaluating the first and second measured data profiles and for identifying the system state on the basis of a combination of the evaluation results of the first and second measured data profiles. In other words, both the first and second measured data profiles are evaluated to determine whether the two measured data profiles simultaneously exhibit specific characteristic measured data profiles such as those corresponding to the (measured) data profiles stored in the comparison memory. By simultaneously checking for instance the current and voltage in the string, the detection of the system state can be made even more reliable since certain faults are better detected when both the voltage profile and the current profile is evaluated. In this manner it is possible to extend the operating state of the system, to extend system operation time over the year, and thus to increase the yield of the system and at the same time to increase system safety.

The write protection of the state memory may be automatically activated as soon as the error state is stored in the state memory. In other words, the entry "error state" may automatically activate a write protection which can only be erased by active deletion.

For example, the write protection may be reset or deleted by manual actuation of an enable switch or by remote-controlled starting of a starter circuit, by sending a start signal to an interface of the starter circuit, so that the photovoltaic system is again available for generating electric power. Further preferably, this operation is restricted to skilled personnel, for example by integrating appropriate blocking or security mechanisms.

The string line may have a starter circuit connected thereto, which reads out the state memory holding the system state and which is adapted to inject a starting current or a start signal into the string line in response to the system state. In other words, the starter circuit outputs the enable signal to the solar modules in form of the starting current or start signal. At least one of the solar modules preferably has associated therewith a safety circuit that is responsive to the starting current or start signal to enable the feeding of solar power generated by the solar module through the solar junction box via a string line. In other words, the safety circuit of the solar module detects the enable signal and in response thereto enables the solar module to supply electric power from the solar module. In response to an absence of the starting current or start signal injected into the string line, the safety circuit preferably disconnects the solar module from the photovoltaic system. That means, the safety circuit separates the solar module from the string line, which is to say isolates the solar module. Thus, the individual module voltages can no longer add up to a string voltage so that dangerous voltage levels can be prevented.

Thus, in the operating state the solar power generated by the associated solar module is supplied through the solar junction box via the output side connection elements and the string line to the inverter and thus into the power grid. In the safe state or in the error state the associated solar module is deactivated or disconnected (from voltage) with respect to the connected string line, by means of the safety circuit.

A solar module that includes such a safety circuit will be referred to as a "smart solar module" below. Ideally, all or at least almost all solar modules are smart solar modules, so that all or almost all solar modules of the string can be disconnected individually, which guarantees safety during initial installation of the photovoltaic system, during maintenance and repair works, and in the event of an incident such as fire, since in such a case only a few or even none of the solar modules will apply a voltage to the string line. The smart solar modules may even be configured so as to be disconnected when shadowed or at night.

However, after such disconnection the solar modules have to be re-enabled, i.e. have to be reconnected to the string. For this purpose, a starter circuit may be provided which is adapted to inject a starting current or a start signal into the string line. In the safe state, the smart solar modules will close the electrical circuit of the string, despite the disconnected solar modules, preferably by means of short-circuiting switches which short-circuit the output-side positive and negative connection elements in the safe state. In other words, when a smart solar module is disconnected, the solar module is electrically bypassed by the safety circuit.

Particularly preferably, the evaluation means may be provided as an enhancement of the starter circuit. In this case, the evaluation means is part of the starter circuit. The measuring device is preferably also part of the starter circuit. In this case, the evaluation means may be arranged in a start box connected to the string separately from the solar modules, along with the starter circuit or as a part thereof.

In the safe state or in the error state, the safety circuit may be powered by the associated solar module, provided that the associated solar module is able to supply power, i.e. is illuminated or irradiated by light. In this manner it can be ensured that the safety circuit is able to switch from the safe state or from the error state to the operating state.

The evaluation means may be powered by a power source, in particular a non-smart solar module or a power supply unit, to raise the voltage profile to a minimum level greater than zero. The power source may be configured so as to raise the voltage level or voltage profile when it falls below the minimum level. In a simple example, the power source may be a power supply unit which is connected to a string of the solar system and which provides a voltage of 30 volts each time the string voltage falls below 30 volts, preferably 20 to 40 volts. As a result, the string voltage is thus raised to a minimum level. Such a minimum level simplifies the detection of a fault condition. For example in case of an in-field line rupture, the string voltage will typically fall below the minimum voltage. This may also happen with the power source connected. That means, a drop below the minimum voltage may be identified as a fault under certain conditions.

The safety circuit associated with a solar module may comprise a current sensor which measures or detects the starting current injected into the string line by the starter circuit, in order to automatically switch the safety circuit from the safe state or the error state to the operating state, and vice versa, in response to the measurement result.

The safety circuit may further be adapted to automatically switch from the operating state to the safe state when the associated solar module is shadowed or in case of general darkness and the associated drop of module voltage. The evaluation means may further be adapted to automatically switch from the operating state to the safe state when the voltage falls below a minimum operating voltage so causing a normal shutdown of the inverter in case a large surface area is shadowed or in case of general darkness, so that no starting current or start signal is transmitted to the solar modules any longer.

The starter circuit may at least comprise a first switch by means of which an electrical circuit in the string can be closed to start the string. In other words, the starter circuit is able to start the whole string, possibly including non-smart solar modules, i.e. electrically connect the string to the inverter.

The starter circuit may comprise a current source which supplies the starting current or the start signal injected into the string line.

The starter circuit may further include a controller having an interface, and/or an external enable switch. The controller may control the injection of the starting current or start signal into the string line in response to an activation signal at the interface and/or in response to an actuation of the enable switch and/or in response to a signal of an irradiation sensor and/or in response to a timer.

The controller may comprise at least one signal output, which signals the safe state, the operating state, and/or an error state.

Furthermore, according to the present disclosure, a start box comprising a starting circuit is adapted for being connected to the string line of a photovoltaic system and for injecting the starting current or the start signal into the string line in response to the system state stored in the state memory to cause the safety circuit to switch from the safe state to the operating state or to the error state, and to cause writing of the system state into the state memory.

Furthermore, the safety circuits of the smart solar modules may be configured so as to switch from the safe state to the operating state in response to the starting current or start signal injected into the string line, i.e. so as to preferably open the short-circuiting switch preferably accommodated in the respective solar junction box, and/or to reconnect the solar module to the string line and to start the string or the photovoltaic system in this way. In the error state and optionally in the safe state, the injected starting current or start signal will flow or run through the serial string line and the solar junction boxes.

In a simple example, the starting current is a constant current which is measured by the safety circuit of the smart solar modules, and in response thereto the safety circuit switches from the error state or from the safe state to the operating state. However, the starting current may as well be pulsed, i.e. provided in form of one or more current pulses. It is even possible to transfer additional information which has an influence on the operational behavior of the safety circuit to the smart solar junction boxes, through the current level and/or pulse shape. The starting current may even contain higher coded information, e.g. in a signal encoded by current pulses, or a higher level communication may be effected via the string, e.g. power-line, by modulating and thereby injecting appropriate starting signals to the string line. Here, it is preferable to cause the safety circuits to switch to the safe state in the absence of the starting current or start signal, so that in this way at all times the highest possible safety is ensured in the sense of a "failsafe"

principle. In other words, the safety circuits will only enable the smart solar modules when the safety circuits detect the starting current or the start signal.

The present disclosure thus provides not only the possibility to disconnect individual solar modules from the string, but also provides a way for safely connecting or reconnecting the individually disconnected smart solar modules. Other safety or functionality related parameters, such as module voltage, string voltage, and/or module temperature may also be monitored, and the switching of the safety circuit between the safe state and the operating state may optionally further be controlled in response thereto.

In other words, the smart solar modules may not only be enabled or disabled "remotely controlled" by the starter circuit, rather the individual smart solar modules may optionally enable or disable themselves, for example in the event that individual modules are shadowed or have an electric fault that does not affect the whole string. In this manner the string may continue to supply power while the safety circuit disconnects the individual defective smart solar module from the string.

According to one embodiment, the starter circuit is accommodated in a start box that is separately connected to the string line and is in particular connected to the string line in series with the solar modules. The start box is preferably disposed in the vicinity of the inverter, or in case of a residential system inside the building, so as to be accessible to the user, so that in this manner the switching operations of the smart solar junction box can be initialized easily. Also, maintenance and replacement of the start box are simplified in this way.

According to a simple embodiment, the starter circuit comprises a switch connected in series with respect to the string line, which switch is closed to close the electrical circuit of the string line including the starter circuit and to cause the starting current to flow or the start signal to run in the so closed electrical circuit of the string line and the solar modules. The so closed electrical circuit composed of the string line with the solar modules and starter circuit is preferably connected in parallel to the inverter, i.e. bypasses the inverter. In other words, the starter circuit in the string preferably forms a shunt or bypass with respect to the inverter, or the starter circuit is connected to the string line in series with the solar modules and in parallel to the inverter.

The safety circuit of the smart solar modules preferably comprises a short-circuiting switch connected in parallel to the solar module between the output-side positive and negative connection elements, and comprises an isolating switch connected in series in the string. The short-circuiting switch is closed in the safe state, thereby short-circuiting the output-side positive and negative connection elements of the solar junction box. The isolating switch is open in the safe state, thereby disconnecting the short-circuiting switch from the solar module, at least on one side. In the operating state, the short-circuiting switch is open and the isolating switch is closed, thus allowing to supply the photovoltaically generated power from the solar module without loss. The disconnection of the solar module from the short-circuiting switch in the safe state ensures that the safety circuit is powered by the associated solar module even in the safe state, provided that enough light is irradiated.

Preferably, the solar junction box has a central bypass circuit, in particular a central bypass diode which is connected in parallel to the short-circuiting switch. The central bypass circuit additionally prevents damage to the associated solar module in case of shadowing, in the usual manner.

In particular, the safety circuit comprises an electronic control device, such as in form of a microcontroller which may for instance be accommodated in the respective solar junction box and controls the switching between the safe state and the operating state of the safety circuit in response to the starting current or the start signal injected into the string line, i.e. in particular controls the isolating switch and/or the short-circuiting switch, by opening the short-circuiting switch and/or closing the isolating switch when the safety circuit switches from the safe state to the operating state. For this purpose, the microcontroller is powered by the solar module not only in the operating state but also in the safe state, in order to be able to control the switching operations.

According to one embodiment the safety circuit includes a current sensor which measures (detects, in the simplest case) the starting current injected into the string line. The control device reads the current sensor for automatically switching the safety circuit from the safe state to the operating state in response to the measurement result, and for this purpose, again, the electric power for operating the controller is in particular supplied by the associated disconnected solar module.

Preferably, the safety circuit is accommodated in the solar junction box. Furthermore, the safety circuit is adapted to automatically switch from the operating state to the safe state when the associated solar module is shadowed or in general darkness which is accompanied by a drop in module voltage below a predefined threshold. Preferably, for this purpose, the short-circuiting switch is provided in form of a normally closed switch which is closed in the normal state, and/or the isolating switch is provided in form of a normally open switch which is open in the normal state. This ensures that the safety circuit automatically switches to the safe state when the power provided by the associated solar module is no longer sufficient to power the control device, for example when it is getting dark. In other words, in the safe state the short-circuiting switch and the isolating switch are in the normal state and have to be activated by the control device in order to switch from the normal safe state into the operating state in response to the activation of the safety circuit. Accordingly, the safe state is the normal state of the safety circuit and switching from the normal safe state into the operating state requires an active starting operation. This increases the safety of the photovoltaic system.

Furthermore preferably, the solar junction box comprises at least one of the following devices:
 a first voltage sensor which measures the module voltage of the associated solar module;
 a second voltage sensor which measures the string voltage;
 a temperature sensor which monitors the temperature of the associated solar module;
wherein the control device reads out the first voltage sensor and/or the second voltage sensor and/or the temperature sensor and controls the safety circuit in response thereto. In particular, the safety circuit automatically switches to the safe state when one or more of these values fall outside predetermined interval limits. For example, during normal operation the inverter sets the current and voltage to the point of maximum power (also known as "Maximum Power Point", or "MPP"). When, for example, the values measured by the current sensor and by the first and/or second voltage sensors deviate therefrom, the safety circuit will automatically switch to the safe state. Accordingly, the current sensor has a double function: in the safe state it measures or detects the injected starting current or the start signal, and in the operating state it measures the solar power fed into the string.

According to an embodiment, all solar modules of a string comprise a safety circuit as defined above, i.e. are smart solar modules. In particular in this embodiment, the starter circuit or the start box comprises its own current source for generating the starting current.

Preferably, the short-circuiting switch in the solar junction box is arranged in front of or upstream of the output-side positive and negative connection elements as seen from the positive and negative poles of the solar module, and the isolating switch in the solar junction box is connected in series between the input-side connection element of the voltage-carrying conductor of the positive pole of the solar module and the output-side positive connection element, or is connected in series between the input-side connection element of the voltage-carrying conductor of the negative pole of the solar module and the output-side negative connection element (or the associated port of the short-circuiting switch).

The isolating switch is preferably connected in series with the central bypass circuit, and/or the short-circuiting switch is connected in parallel to the central bypass circuit.

Preferably, the solar junction box has input-side intermediate connection elements for intermediate taps on the solar module and a plurality of sub-module bypass circuits, in particular sub-module bypass diodes to compensate for partial shadowing of the associated solar module, and the sub-module bypass circuits are connected in front of or upstream of the isolating switch and the short-circuiting switch as seen from the poles of the solar module, so that the sub-module bypass circuits remain connected to the solar module even in the safe state.

Preferably, the starter circuit has its own current source independent of the solar modules, and the starting current or the start signal injected into the string line is supplied by this own current source. The current source is for example provided in form of a power supply unit and/or may be integrated in the start box or may be externally connected to the start box. Optionally, the current source of the starter circuit may be configured as an energy storage device which during normal operation stores energy photovoltaically generated by the string and in the starting mode supplies the starting current or start signal using this stored energy.

Preferably, the starter circuit has at least a first switch by means of which, for starting the string, an electrical circuit is closed in parallel to the inverter in the string in order to cause the starting current to flow or the start signal to run in the so closed electrical circuit of the string line so as to switch the safety circuits of the solar junction boxes of the string from the safe state to the operating state, i.e. to start the string.

Further preferably, the starter circuit includes at least one isolating switch by means of which the inverter is disconnected from the string for starting the string.

For injecting the starting current or the start signal into the string line, i.e. for starting the string (start mode), the isolating switch is open and the first switch is closed so that the electrical circuit of the string line is closed. In the start mode, the starter circuit accordingly forms a shunt to the (disconnected) inverter, and the current source for the starting current or start signal forms a closed electrical circuit with the solar modules in order to inject the starting current or start signal via this circuit into the string line to cause it to pass through the solar junction boxes. Therefore, the first switch is also referred to as a shunt switch herein.

The isolating switch is connected in series with the inverter for disconnecting the latter from the string in the start mode of the starter circuit. In the embodiment in which the starter circuit has an own current source, the first switch is preferably connected in series with the own current source and/or the isolating switch is connected in parallel with the own current source.

During normal operation of the photovoltaic system when the safety circuits of the solar junction boxes are in the operating state, the isolating switch of the starter circuit is closed and the first switch or shunt switch of the starter circuit is open, so that the supply of the generated solar power is not affected. In other words, during normal operation of the photovoltaic system the shunt to the inverter defined by the starter circuit is open.

Furthermore preferably, the starter circuit comprises an electronic controller, e.g. microcontroller that has an electronic interface and/or an external enable switch, and the controller controls the injection of the starting current or start signal into the string line in response to an enable signal at the electronic interface and/or in response to an actuation of the enable switch.

It is moreover preferable if the controller has at least one signal output which signals the safe state and/or an error state, e.g. via a light emitting diode. However, the controller may as well have an electronic interface which forwards the safe state and/or an error state, e.g. to a central computer.

Preferably, the solar junction box includes at least an anti-theft means, a maximum power point tracking (MPPT) controller, a voltage monitoring means, a current monitoring means, and/or a temperature monitoring means which are connected in front of or upstream of the isolating switch and the short-circuiting switch as seen from the poles of the solar module, and the anti-theft means, the MPPT controller, the voltage monitoring means, the current monitoring means, and the temperature monitoring means are powered by the associated solar module even in the safe state.

In summary, the starter circuit therefore comprises at least the following components:
a first measuring device for measuring a first data profile, in particular
a voltage sensor for measuring the string voltage, and/or
means for measuring the string power; and/or
evaluation means for evaluating the first measured data profile and for detecting a system state based on the first measured data profile;
a state memory for storing the system state.

The starter circuit preferably further comprises at least one of the following additional components:
a second measuring device for measuring a second data profile, in particular
a current sensor for measuring the string current, and/or
means for measuring string power, and/or
wherein the evaluation means is adapted for evaluating both measuring devices;
means for detecting arcing in the string; and/or
means for theft detection in the string; and/or
an interface to output the corresponding values or an appropriate signaling.

This information may also be relayed via the interface of the controller, for example to a central computer.

According to another embodiment, at least one solar module of a string does not have the safety circuit described above, which means that this solar module is not "smart" in the above sense so that this solar module will not be set to a safe state but will permanently remain connected to the string. In this case, the solar voltage supplied by this non-smart solar module can be used as a voltage source for injecting the starting current or start signal into the string line to effect the switching of the safety circuits of the other solar modules from the safe state to the operating state and, if necessary, to raise the voltage curve to a minimum value greater than zero. Therefore, optionally, the power supply unit of the starter circuit can even be dispensed with. Namely, in this case the non-smart solar module will feed solar power into the string line, e.g. at sunrise, while the smart solar modules are still disconnected. The disconnected smart solar modules may then be triggered by means of this solar power to switch from the safe state to the operating state.

The present disclosure further relates to the start box including the starter circuit, which is configured for being connected to the string line of a photovoltaic system and for injecting the starting current or start signal into the string line to cause the safety circuit to switch from the error state or from the safe state to the operating state, or from the operating state to the error state or to the safe state.

Another aspect of the present disclosure is the method for safely starting the string of series-connected solar modules.

In the safe state, the solar modules are individually disconnected from voltage with respect to the string line, by the safety circuits. In response to the injection of the starting current or start signal into the string line, each of the safety circuits will connect the respective associated solar module to the string, so that subsequently the generated solar power can be supplied via the string.

The injection of the starting current or start signal is controlled by a central start box connected to the string, in response to:
- manual actuation of an enable switch on the start box, e.g. by the installing person after initial installation or after maintenance works; and/or
- remote-controlled starting of the starter circuit by transmitting a start signal to the electronic interface of the controller of the starter circuit, e.g. by the installing person after initial installation or after maintenance works; and/or
- automatic starting in response to a timer; and/or
- automatic starting in response to an evaluation of an irradiation sensor connected to the starter circuit, e.g. every morning after sunrise when light irradiation is sufficient for supplying photovoltaically generated power from the photovoltaic system into the power grid.

As already described above, the starting current or start signal injected into the string line is supplied by:
- an own current source of the starter circuit, e.g. an internal or external power supply unit or an energy storage device; and/or
- a solar module of the string having a solar junction box without the safety circuit described above, i.e. a non-smart solar module.

For injecting the starting current or start signal into the string line to cause the safety circuits to switch from the safe state to the operating state, at least some of the following steps are performed in the starter circuit:
- closing the shunt switch in the start box to close the electrical circuit of the string including the solar modules, and injecting the starting current or start signal into the string line;
- measuring the string voltage in the start box by the first measuring device;
- when the string voltage exceeds a predefined threshold (e.g. the predefined threshold is the starting voltage at the inverter),
- disconnecting the current source for injecting the starting current or start signal into the string from the string, in particular by opening the shunt switch of the start box;
- closing the isolating switch to connect the inverter to the string; and/or
- charging an input capacitor at the inverter of the string until the charge/discharge curve of the input capacitor becomes flat.

The present disclosure will now be explained in more detail by way of exemplary embodiments and with reference to the figures in which the same and similar elements are partly denoted by the same reference numerals. The features of the various exemplary embodiments may be combined.

BRIEF DESCRIPTION OF THE FIGURES

In the figures:

FIG. 12 is a flow chart illustrating the controlling of the starter circuit with state memory;

FIG. 13 shows a graph of typical voltage and current profiles in case of a normal system shutdown at sunset;

FIG. 14 shows a graph of typical voltage and current profiles in case of a normal system shutdown upon inverter disconnection;

DETAILED DESCRIPTION

Figure 1:
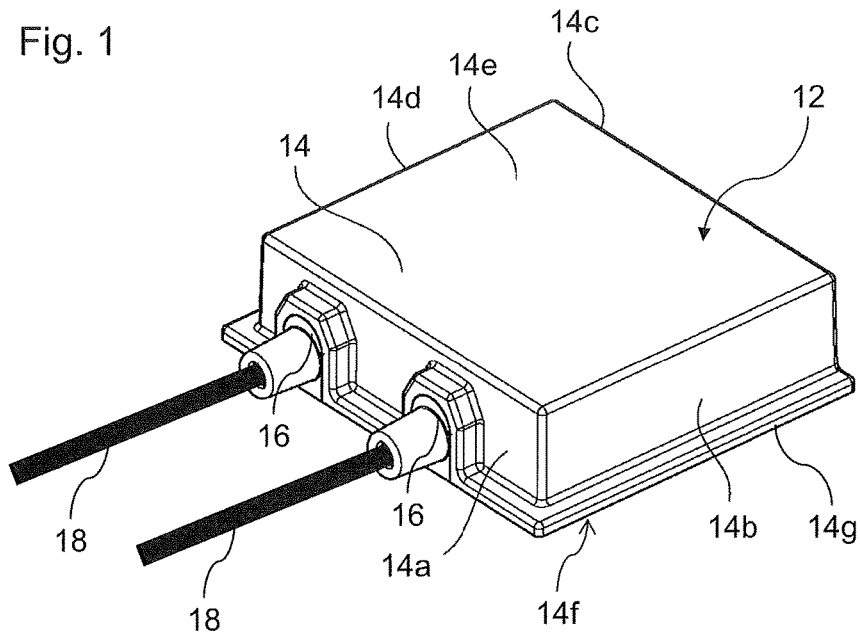
FIG. 1 is a perspective view of a typical solar junction box.

FIG. 1 shows a solar junction box 12 comprising a junction box housing 14 for being mounted on the rear side of a solar module. The dielectric junction box housing 14 has a hat-like shape, with circumferential side walls 14a to 14d and a cover 14e. On the bottom surface 14f of junction box housing 14, not visible in FIG. 1, openings are provided through which the conductor ribbons extending out of the solar module enter the solar junction box 12 to be electrically connected there. On one of the side walls, 14a, the junction box housing 14 has two cable feedthroughs 16 through which the string line 18 extends into the solar junction box 12 to be connected inside junction box housing 14, for example by means of contact terminals, not shown, in order to supply the electric power generated by the solar module. A collar 14g serves to glue the solar junction box to the solar module. For the basic structural design of solar junction boxes reference is further made to DE 10 2007 037 130 A1 and DE 10 2007 042 547 A1.

Figure 2:
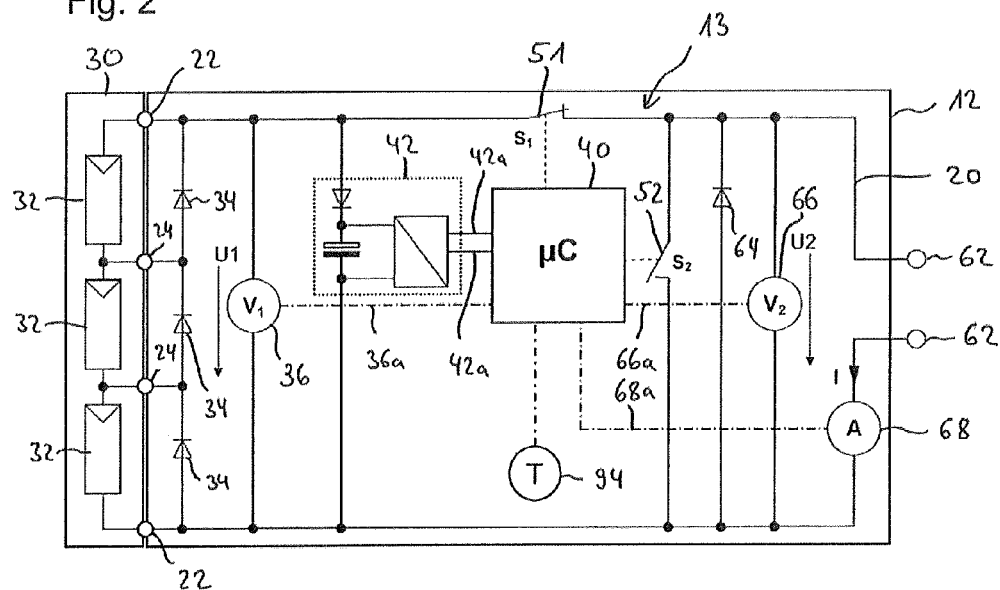
FIG. 2 shows a block diagram of a solar module comprising a smart solar junction box, in the operating state.

FIG. 2 shows a block diagram of solar junction box 12 which is connected to the respective conductor ribbons of the solar module 30 via input-side positive and negative connection elements 22 and, in this example, via two intermediate taps 24. Bypass diodes 34 are connected in parallel with the solar cells or solar sub-modules 32, in order to be able to compensate for partial shadowing of the solar module 30.

Solar junction box 12 comprises a safety circuit 13 which permits to switch the solar junction box 12 from the operating state or operating mode to the safe state or safety mode and vice versa and which will be described in more detail below.

A voltage sensor 36 ($V_1$) connected in parallel to the solar module 30 measures the module voltage U1 and is read out by a control device in form of a microcontroller 40 via link 36a. Furthermore, a power supply unit 42 is connected in parallel with the solar module 30 to power the microcontroller 40 via supply lines 42a, so that the microcontroller is able to control the solar junction box 12. A serial isolating switch 51 (S1) in solar junction box 12 is connected into string 20 in series with the solar module 30, which isolating switch is closed in the operating state as illustrated in FIG. 2 in order to supply the power photovoltaically generated by the solar module 30 via string 20. Output-side positive and negative connection elements 62 can be short-circuited by a short-circuiting switch 52 (S2) in solar junction box 12, and this short-circuiting switch 52 is open in the operating state. A central bypass diode 64 between positive and negative connection elements 62 and short-circuiting switch 52 provides another bypass, for example in the event of a malfunction of short-circuiting switch 52.

An output-side voltage sensor 66 measures the string voltage (U2), independently of the switching state of switches 51 and 52, and this sensor 66 is read out by microcontroller 40 via link 66a. A current sensor 68 measures the string current during the operating state illustrated in FIG. 2, and also measures the starting current or detects the start signal during the safe state illustrated in FIG. 3, and this sensor 68 is read out by microcontroller 40 via link 68a. Microcontroller 40 reads input-side voltage sensor 36, output-side voltage sensor 66, and current sensor 68, and controls isolating switch 51 and short-circuiting switch 52 in response to the measured values.

Figure 3:
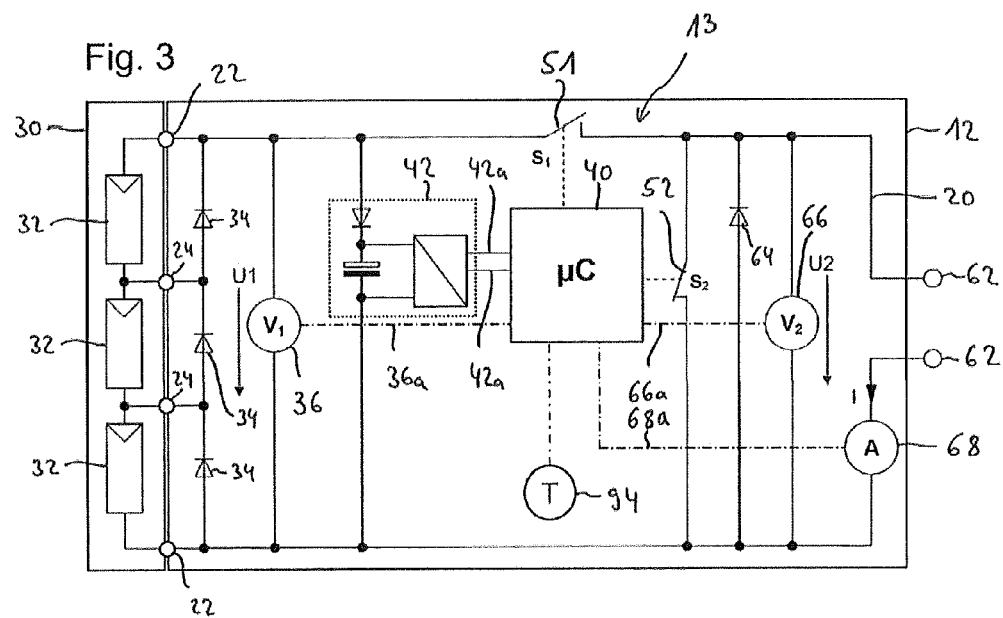
FIG. 3 shows the solar module of FIG. 2, but in the safe state.

FIG. 3 shows a block diagram of smart solar junction box 12 in the safe state. In the safe state the isolating switch 51 is open and the short-circuiting switch 52 is closed, so that the solar module 30 is disconnected from string 20 on the one hand, and on the other the string 20 is short-circuited by short-circuiting switch 52. Even in the safe state, power supply unit 42 is powered by the associated solar module 30, provided that solar module 30 is illuminated. Power supply unit 42 in turn powers microcontroller 40, so that the latter remains in operation even in the safe state, provided that illumination is sufficient. In other words, even in the safe state shown in FIG. 3, microcontroller 40 is able to read out the input-side and/or output-side voltage sensors 36, 66 and/or in particular current sensor 68, and/or to control switch 51 and/or 52. Preferably, isolating switch 51 is configured as a normally open switch, and/or short-circuiting switch 52 is configured as a normally closed switch, so that the safe state illustrated in FIG. 3 corresponds to the normal or non-actuated state of switches 51, 52. This has the benefit that at the latest when the solar module no longer supplies enough power for powering microcontroller 40, in the absence of sufficient illumination, the "smart solar junction box" 12 (i.e. the solar junction box of a smart solar module) automatically switches to the safe state.

Now, when all solar junction boxes 12 of a string 20 are in the safe state this means that no photovoltaically generated current flows and the solar junction boxes will not readily come out of the safe state, even if for example the sun rises and illumination is sufficiently strong. If a plurality of solar junction boxes 12 would simply open the short-circuiting switch 52 and close the isolating switch 51 at the same time, this would lead to a situation where voltages hazardous upon contact might be produced. Therefore, a problem on which the present disclosure is based is to ensure that the electrical circuit of string 20 is closed when the solar modules apply a photovoltaically generated voltage to the string, so that no so-called open voltage may exist at possibly open contacts when the circuit is not closed.

To this end, a starting current or start signal is injected from an external start box 70 into the electrical circuit of string 20 which is closed even in the safe state of solar junction boxes 12.

Figure 4:
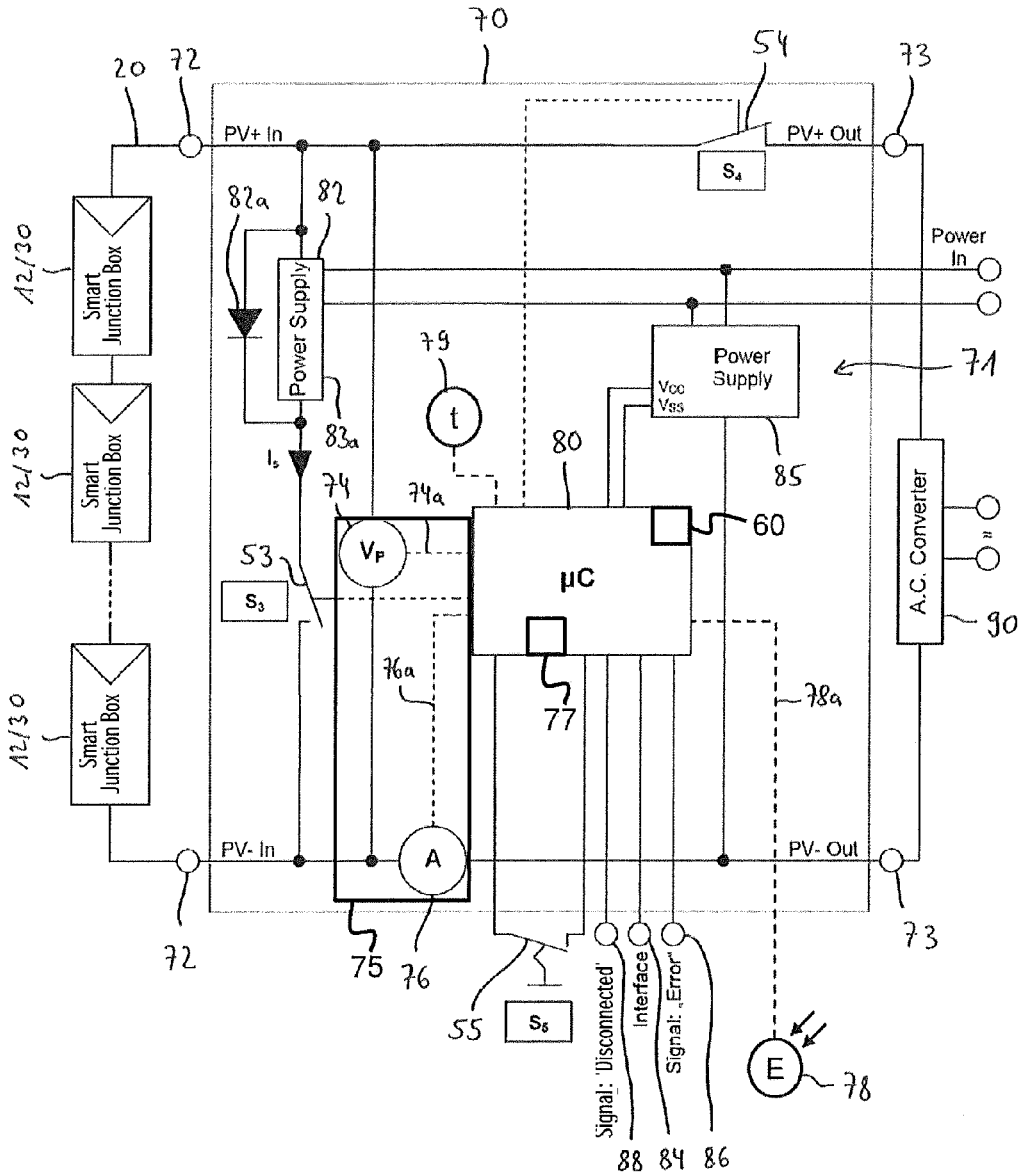
FIG. 4 shows a block diagram of a starter circuit comprising an own current source in the symbolized string that includes a plurality of solar modules.

Referring to FIG. 4, start box 70 is connected to string 20 comprising solar modules 30 and the associated smart solar junction boxes 12, and for normal operation of the photovoltaic system 1 start box 70 is in the state illustrated in FIG. 4. In this example, start box 70 is connected in both lines (positive and negative line) of the string—i.e. with two poles on both sides—in series between the series-connected solar modules 30 and inverter 90. To this end, start box 70 is connected to the solar generator consisting of solar modules 30 via two input terminals 72, and start box 70 is connected to the inverter via the two output terminals 73. A voltage sensor 74 ($V_P$) measures the string voltage U3. A current sensor 76 (A) measures the current in the string, which may either be the photovoltaically generated solar current in the operating state, or the starting current in the safe state or starting mode. An irradiation sensor 78 measures the available light. A controller or microcontroller 80 is connected, via links 74a, 76a, 78a, to voltage sensor 74, current sensor 76, and irradiation sensor 78 to read them out in order to monitor the string voltage, the current in the string and the irradiation, and to control the starter circuit 71 in start box 70 in response to these measured data.

In the present example, the starter circuit comprises an internal current source 82 which has a diode 82a connected in parallel thereto in the forward direction with respect to the solar current. Microcontroller 80 controls an isolating switch 54 which is connected, with respect to the string 20 comprising the solar modules 30, in parallel to current source 82 and in series to the inverter 90, and/or a first switch 53 which is connected in series with respect to the string 20 comprising the solar modules 30 and to current source 82. In this example, current source 82 is provided as an internal power supply unit 83a of start box 70. In the operating state of photovoltaic system 1 illustrated in FIG. 4, the isolating switch 54 is closed and the first switch or shunt switch 53 connected in series with current source 82 is open, so that in this state the illustrated starter circuit 71 is virtually lossless and the photovoltaically generated current can flow through the starter circuit 71 to the inverter 90 almost without loss.

To start the string 20 or the smart solar junction boxes 12, isolating switch 54 is open and shunt switch 53 is closed. Now, the starting current $I_S$ generated by current source 82 is injected into string 20 for a predetermined time $t_S$. Here, the photovoltaic system 1, i.e. the smart solar junction boxes 12 are initially still in the safe state, so that on the one hand the starting current or start signal injected into in the string can flow through the string, and on the other hand no photovoltaically generated current flows through the string in this example.

Once all smart solar junction boxes 12 have been activated in response thereto, i.e. have switched from the safe state to the operating state, shunt switch 53 is re-opened and isolating switch 54 is closed, so that then the photovoltaically generated current can flow through string 20 and the corresponding photovoltaic power can be fed into the power grid.

If the starting or the start sequence fails, it can be repeated automatically, again controlled by microcontroller 80. Since microcontroller 80 monitors and evaluates the string voltage and the string current using voltage sensor 74 and current sensor 76, the measured values can be used to calculate string power and to control the switching operations.

By using a manual enable switch 55 (S5) it is furthermore possible to manually initiate the starting operation at start box 70, i.e. to manually start the photovoltaic system 1 to set it from the safe state to the operating state. An electronic interface 84 of microcontroller 80 allows to read out this information, for example by a computer. Microcontroller 80 further includes signaling means 86, 88, for example in form of light emitting diodes, which indicate a possible error state ("error") or the presence of the safe state ("disconnected") at start box 70.

The starting may as well be initiated via interface 84 ("interface") by a higher-level controller, or the digital port to which enable switch 55 is connected may be switched by a higher-level controller. In other words, a start command for injecting the starting current or start signal may be given via interface 84.

In everyday normal operation, the string is automatically started at sunrise by starter circuit 71, so that adequate yield of the system is assured. This may be controlled or initiated at fixed points in time in response to a timer 79 or by reading out irradiation sensor 78, which are also part of the starter circuit 71 or are connected to microcontroller 80.

After sunrise, the microcontrollers 40 of the smart solar junction boxes 12 will be powered by the associated solar modules 30, so that the microcontrollers are enabled in terms of power supply to control the smart solar junction boxes even in the safe state that will initially still exist, in particular in order to switch from the safe state to the operating state.

For starting, the starter circuit 71 then injects the starting current $I_S$ from current source 82 into the string 20, with the isolating switch 54 already open or by opening the latter and by closing shunt switch 53, which starting current is detected by the smart solar junction boxes 12 which are still in the safe state, by means of current sensor 68, and in response thereto microcontroller 40 controls the smart solar junction boxes 12 to switch from the safe state to the operating state, in the present example by closing isolating switch 51 and by opening short-circuiting switch 52. In this manner it is ensured that the initiating of the starting process in the smart solar junction boxes 12 is only successful if the electrical circuit of string 20 is closed so that no hazardous open voltage can occur.

The starter circuit 71 with measuring devices 74 and 76 permits to measure voltage and current in the string 20 and to output the measured values via interface 84. Based on the individual measured values of voltage and current 74, 76 electrical, power value can be calculated and is also provided via interface 84. Furthermore, the individual voltage and current values 74, 76 permit to monitor the functioning, and the result may also be provided via interface 84. Furthermore, optionally, the starter circuit 71 permits to detect arcing in the string 20 (the detection of arcing is not illustrated) and to output these values via interface 84. The circuit 71 also allows theft detection in the string 20 and to output the result via interface 84.

Figure 6:
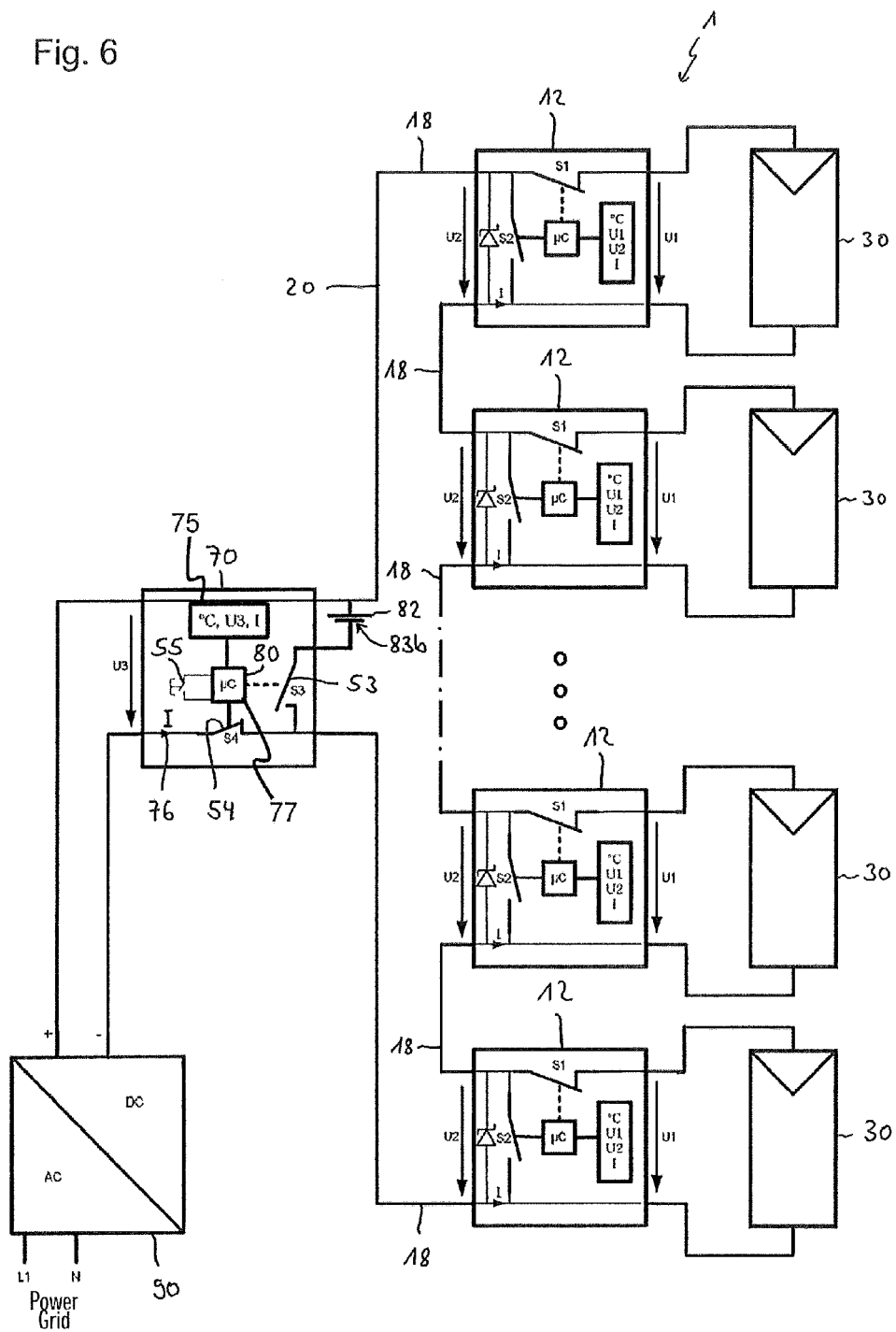
FIG. 6 shows an overview diagram of a string of the photovoltaic system comprising a plurality of smart solar modules, inverter, and start box.

FIG. 6 shows an example of the connection of start box 70 to string 20 which includes a plurality of smart solar junction boxes 12. In contrast to the start box 70 of FIG. 4, the current source 82 is connected externally to start box 70. FIG. 6 illustrates the string 20 of photovoltaic system 1 in the operating state in which the smart solar junction boxes 12 are in the operating state and start box 70 is disabled or inactive by having the shunt switch 53 (S3) open and the isolating switch 54 (S4) closed.

In this example, all solar junction boxes 12 are "smart", so that the string 20 is automatically switched to zero voltage, i.e. is disconnected from voltage at darkness, or is disconnected from voltage by the user in case of an error or incident or maintenance works. Therefore, the power supply for starter circuit 71 or starting current and for microcontroller 80 is for instance provided by connection to the power grid, in the present example by an external power supply unit 83b as a current source 82. For injecting the starting current and thus for starting photovoltaic system 1, the isolating switch 54 (S4) is opened and the shunt switch 53 (S3) connected in series with current source 82 and string 20 is closed. Since shunt switch 53 (S3) connected in series with string 20 and solar modules 30 is connected in parallel to the inverter, the electrical circuit of string 20 is closed by bypassing the inverter 90, so that in the safe state the injected starting current can flow through the string 20 and the solar junction boxes 12. The injected starting current is measured or the start signal is detected in the smart solar junction boxes 12, and in response thereto the respective microcontroller 40 causes the smart solar junction boxes 12 to switch back from the safe state to the illustrated operating state.

In this example, the smart solar junction boxes 12 monitor (as symbolized) temperature ° C., module voltage U1, string voltage U2, and string current I. The smart solar junction boxes 12 are controlled in response to one or more of these measured values. Start box 70 also monitors the current I in the string, temperature ° C., and/or string voltage U3.

Figure 7:
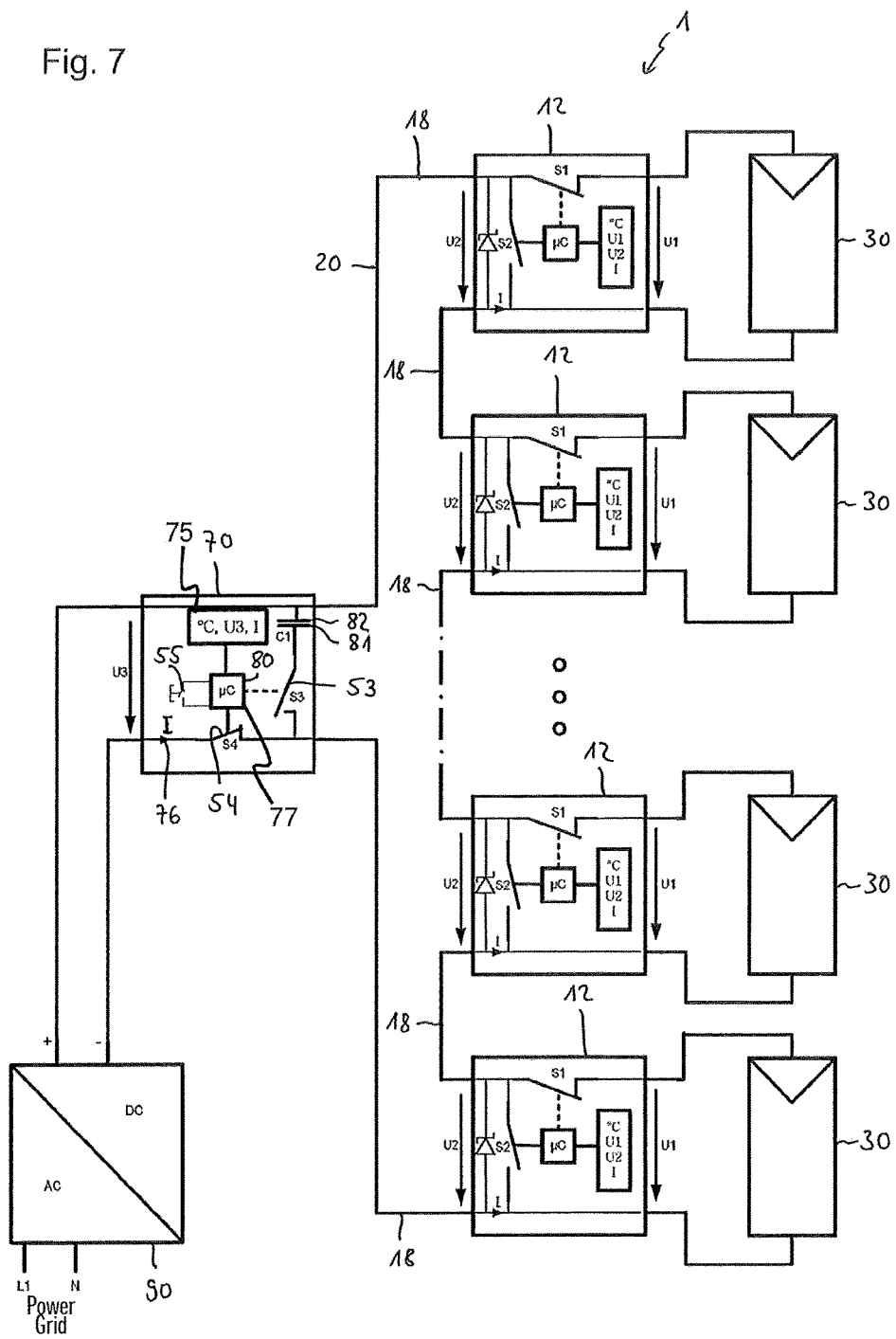
FIG. 7 is similar to FIG. 6, but with another embodiment of a start box.

FIG. 7 shows the string 20 again with only smart solar junction boxes 12 and with a slightly modified embodiment of start box 70. Instead of external power supply 83b as a current source 82 (FIG. 6), the start box 70 of FIG. 7 comprises an (internal) capacitor 81 (C1) as the current source 82. The safety circuits 13 of smart solar junction boxes 12 and the photovoltaic system 1 are started by means of shunt switch 53 (S3) as described below.

When voltage U3 at start box 70 falls below a lower threshold U3, and/or when microcontroller 80 receives a start signal, shunt switch 53 (S3) is closed and thus closes the electrical circuit of the string 20 through the smart solar junction boxes 12 and thereby starts the safety circuits 13 of smart solar junction boxes 12 and thus the photovoltaic system 1. During this starting process, the shunt switch 53 (S3) is closed at least until voltage U3 has exceeded an upper threshold $U3_o$ of e.g. 200 V, and is then re-opened. After that, capacitor 81 (C1) will have been recharged and is ready for the next start, which will occur when the voltage U3 again falls below the lower threshold $U3_u$ and/or the microcontroller again receives a start signal. Otherwise the start box 70 of FIG. 7 operates like the start box 70 of FIG. 6 with the permanent power supply by external power supply unit 83*b*, so that reference can be made thereto.

Figure 5:
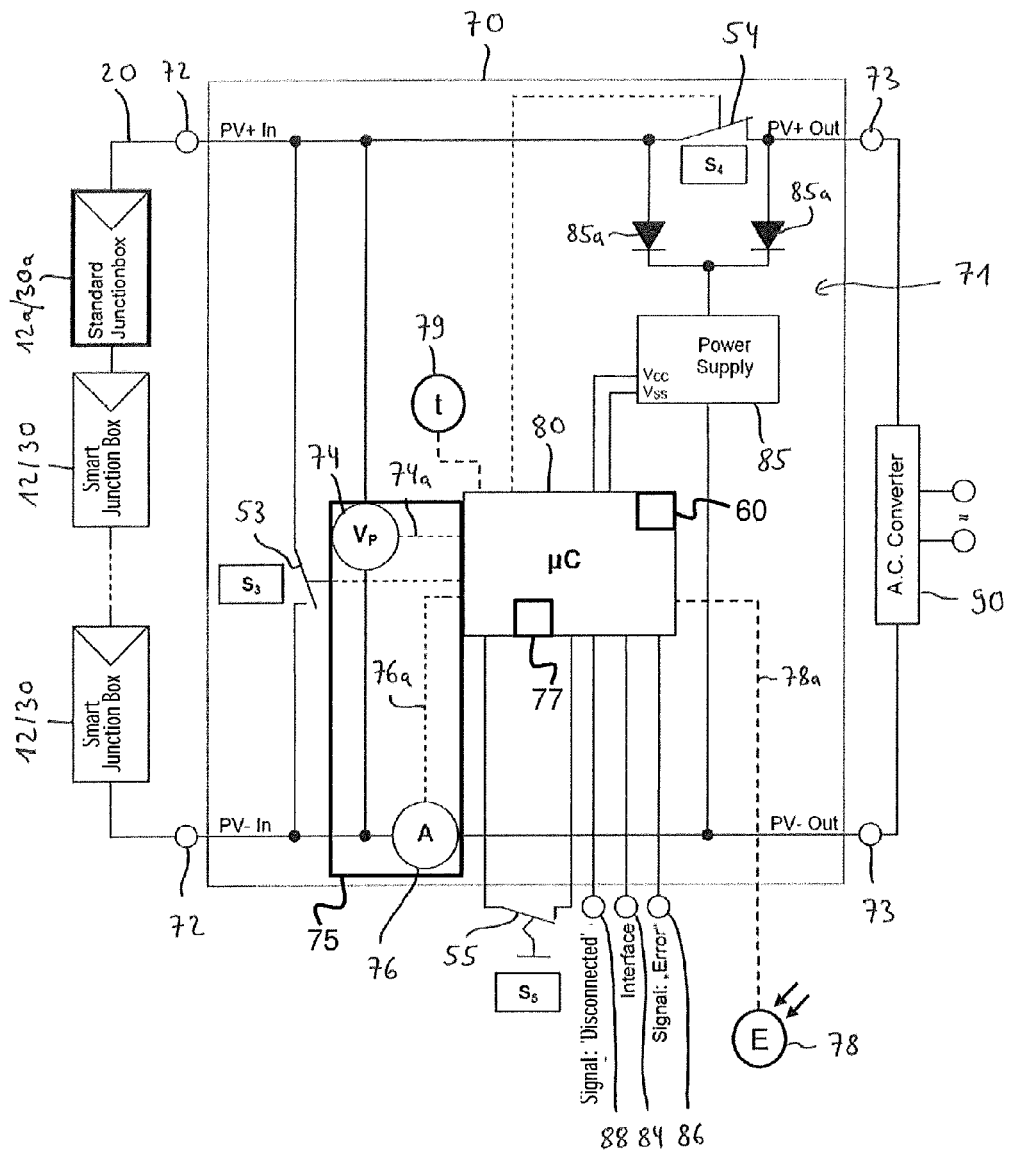
FIG. 5 shows a block diagram of a starter circuit without an own current source in the symbolized string that includes a plurality of solar modules.

FIGS. 5 and 8 show a further embodiment of the string 20 which comprises solar modules 30 having smart solar junction boxes 12 and one or more further solar modules 30*a* having simple conventional solar junction boxes 12*a* ("non-smart", i.e. without the safety circuit described above) which are not illustrated in FIG. 8 for the sake of clarity. In other words, the solar modules 30*a* are not individually switched on and off. The total voltage of the non-smart solar modules 30*a* can be kept below a voltage that would be hazardous when contacted. After sunrise, when the smart solar modules 30 are still disconnected from string 20, the non-smart solar module(s) 30*a* will nonetheless readily apply a voltage to the string 20.

Generally, in this embodiment, at least one solar module 30*a* has no smart solar junction box 12, so in normal operation it will supply the necessary voltage for operating the microcontroller 80 of start box 70 and to provide the starting current for the other, smart solar junction boxes 12 of string 20. Therefore, an own power supply 83*a*, 83*b* of the start box can be dispensed with. In this case, the power supply 85 of microcontroller 80 is fed by the solar power from non-smart solar module(s) 30*a* via diodes 85*a* connected in the forward direction. This translates into reduced costs for purchase, installation, and maintenance.

Figure 8:
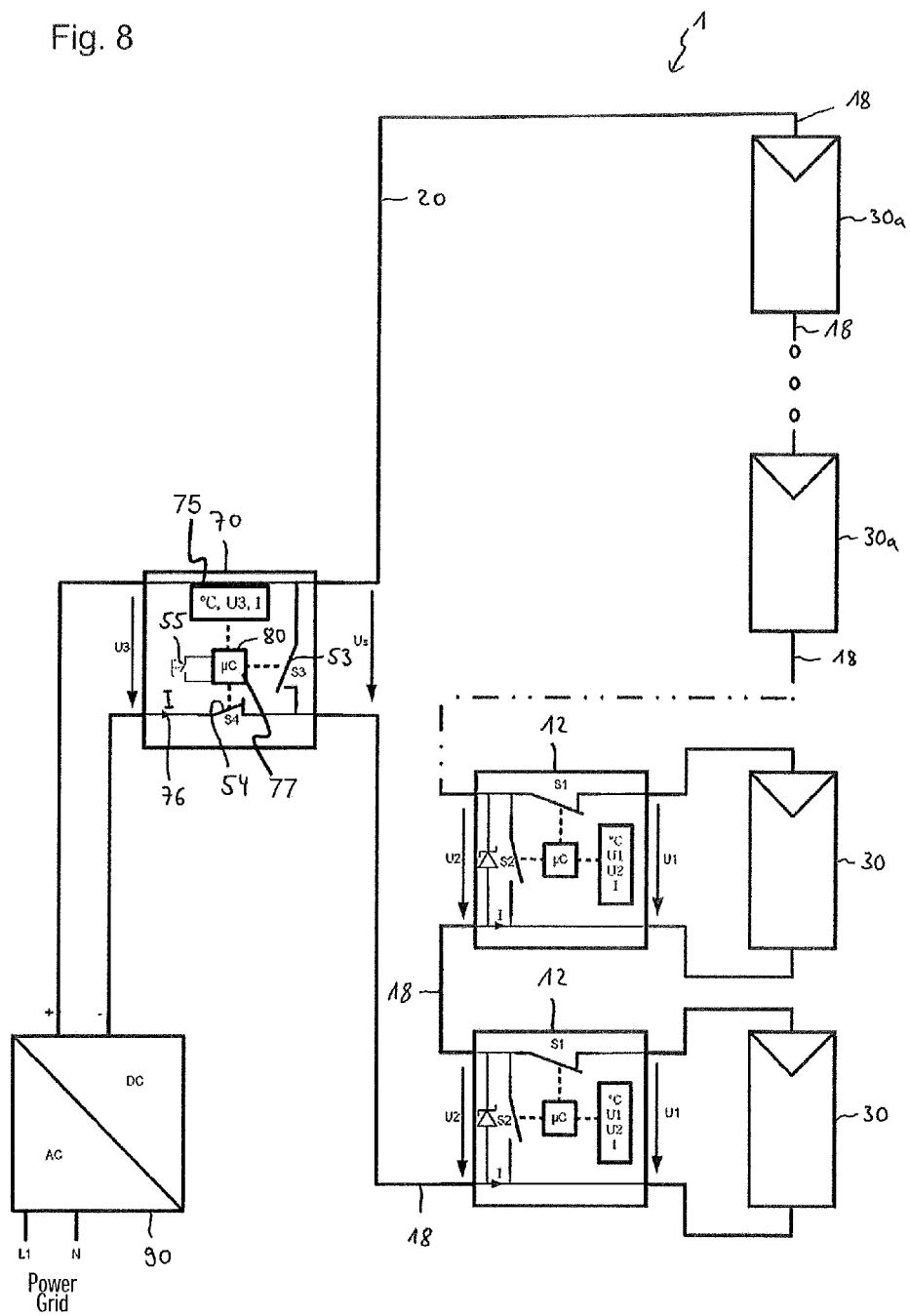
FIG. 8 is similar to FIG. 7, with yet another embodiment of the start box, and partially with non-smart solar modules.

In the simple example illustrated in FIGS. 5 and 8, when the smart solar junction boxes 12 are in the safe state illustrated in FIG. 3, for starting the string the shunt switch 53 (S3) in start box 70 which is connected in series with the string 20 comprising solar modules 30, 30*a* is closed, so that the electrical circuit of string 20 is closed and the current photovoltaically generated by non-smart solar modules 30*a* flows through string 20 and provides the starting current. Thus, here again, shunt switch 53 closes the electrical circuit that comprises solar modules 30, 30*a* by bypassing the inverter 90, in order to inject the starting current or start signal into the string line.

Figure 9:
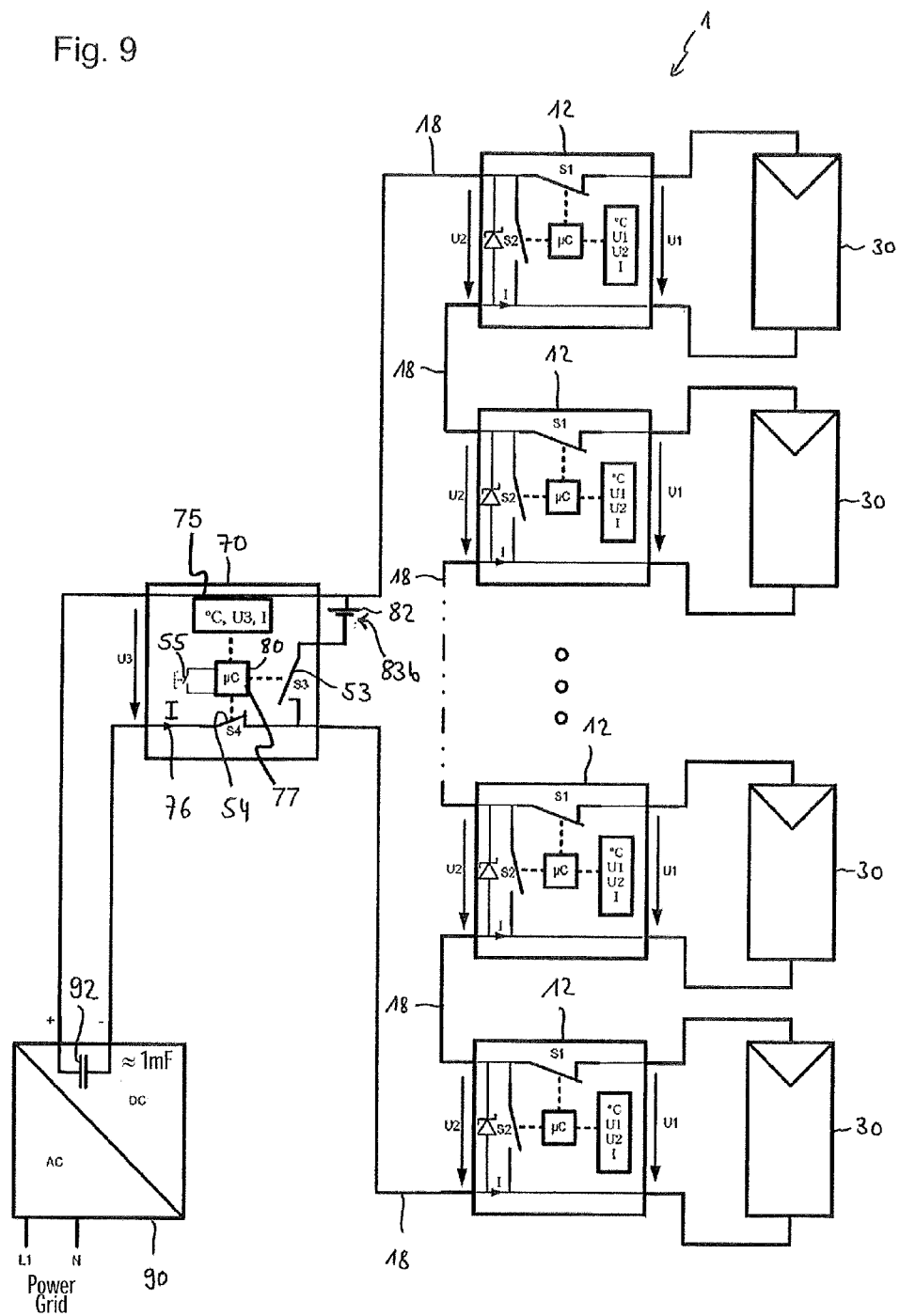
FIG. 9 is similar to FIG. 6, with a further embodiment of the start box and with an inverter having an input capacitor.

FIG. 9 shows a further embodiment of the string 20, in which the inverter 90 is activated by pulses. The inverter 90 has an input capacitor 92 of about 1 mF on the DC side. Inverter 90 has a start-up behavior configured so that when a sufficiently high string voltage is available, the inverter 90 performs a DC line test and subsequently a solar line side load test. To this end, the impedance of the inverter is reduced until, due to the load, the voltage according to the operating point of the solar generator has reduced to a value below the open circuit voltage. When now a value of the product of current and voltage is produced which is above an inverter-specific threshold, the string will start the production of photovoltaically generated power which is fed into the power grid. This means that a high-impedance basic behavior exists during the start-up of inverter 90. Furthermore, the inverter 90 needs a certain time, for example for an earth measurement.

According to the present disclosure the start box 70 will then disconnect the shunt from the PV line or the string 20 when a detected string voltage U3 is above the switching threshold of start box 70. At the inverter 90 the total voltage of the solar modules 30 is applied, which is sufficient to start the solar power system. If now the current flow in string 20*b* is interrupted due to a malfunction of the inverter 90, the start-up process can be repeated. This may be effected automatically by the microcontroller 80 of start box 70 or by an external controller, for example via interface 84, or via the external enable switch 55 (S5), which may optionally be connected to a control center.

In this embodiment, the operation sequence is as follows:
1) Start box 70 is enabled by closing the shunt switch 53 (S3);
2) Starting current $I_{const}$ is injected into the string 20 from the current source 82 (here: external power supply unit 83*b*);
3) When the starting voltage is reached at inverter 90, start box 70 is switched off by re-opening the shunt switch 53 (S3);
4) The isolating switch 54 (S4) of start box 70 is opened and closed in clocked manner, and capacitor 92 of the inverter is recharged until the charge/discharge curve becomes flat (e.g. <5 V/s).

As a starting current, 500 mA are fed at a voltage of 24 V, for example. When voltage U3 exceeds a predetermined threshold, e.g. becomes greater than 100 V, the shunt switch 53 (S3) is opened.

Figure 10A:
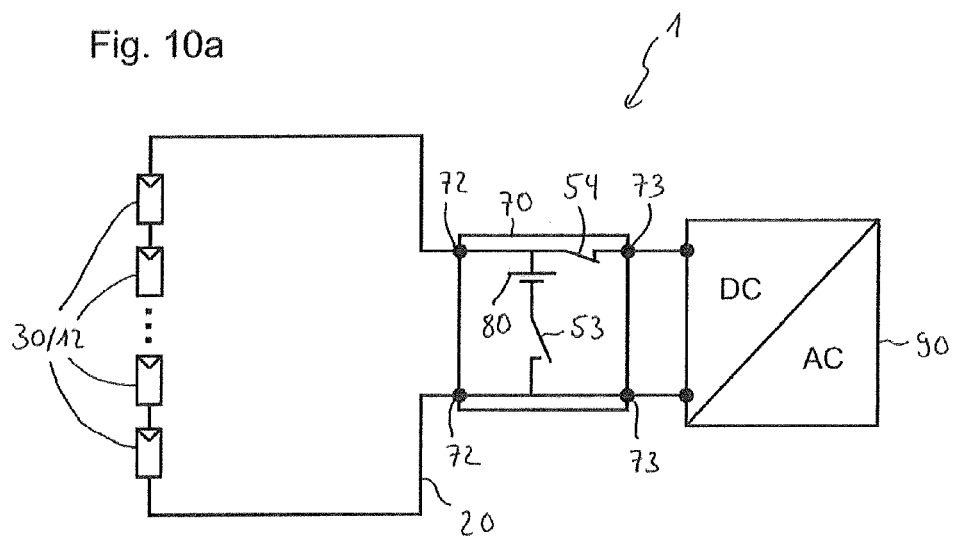
FIG. 10a shows a simplified schematic block diagram illustrating the connection of the start box of FIG. 4, in the operating state of the photovoltaic system.
Figure 10B:
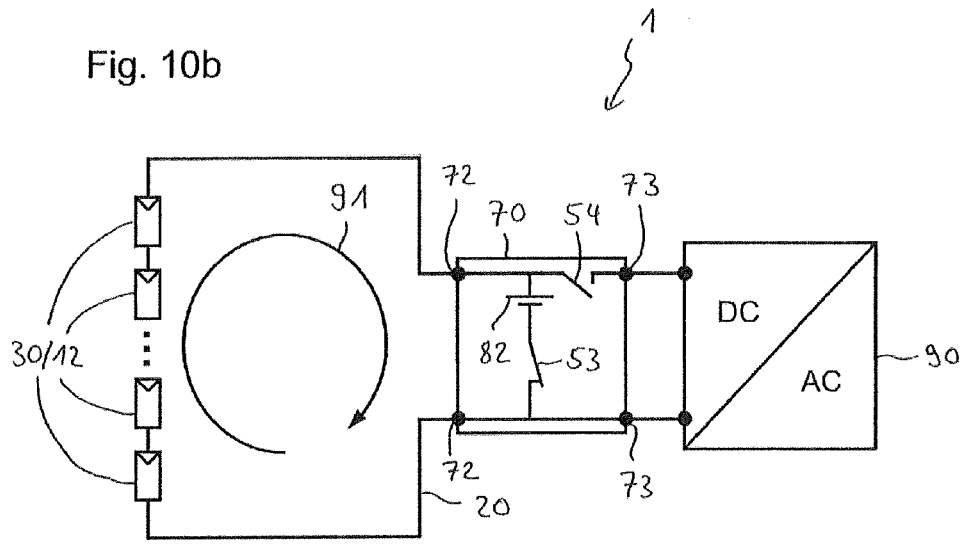
FIG. 10b is similar to FIG. 10a, but with the start box in the starting mode.

FIGS. 10*a/b* show a simplified block diagram of the string 20 with start box 70 of FIG. 4. FIG. 10*a* shows the operating state of the photovoltaic system 1 with shunt switch 53 open and isolating switch 54 closed. FIG. 10*b* shows the photovoltaic system 1 with start box 70 in the starting mode, in which shunt switch 53 is closed and isolating switch 54 is open.

Shunt switch 53 is connected in series with current source 82, and when the shunt switch 53 is closed start box 70 forms an electrical circuit 91 with the solar modules 20 by bypassing the inverter 90. Thus, with the shunt switch 53 closed, start box 70 forms a temporary shunt to inverter 90 which is disconnected from the string by means of isolating switch 54. In other words, in the starting mode the start box 70 defines a shunt current source (FIG. 10*b*).

When shunt switch 53 is open, the shunt switchable by start box 70 is open, and the normal electrical circuit for the operating state of photovoltaic system 1 is formed by the series-connected solar modules 20 and the inverter 90, with the isolating switch 54 closed (FIG. 10*a*).

Switches 51, 52 (S1, S2) of the smart solar junction boxes 12 and/or switches 53, 54 (S3, S4) of start box 70 may be relays, semi-conductor switches, in particular field-effect transistors.

Figure 11:
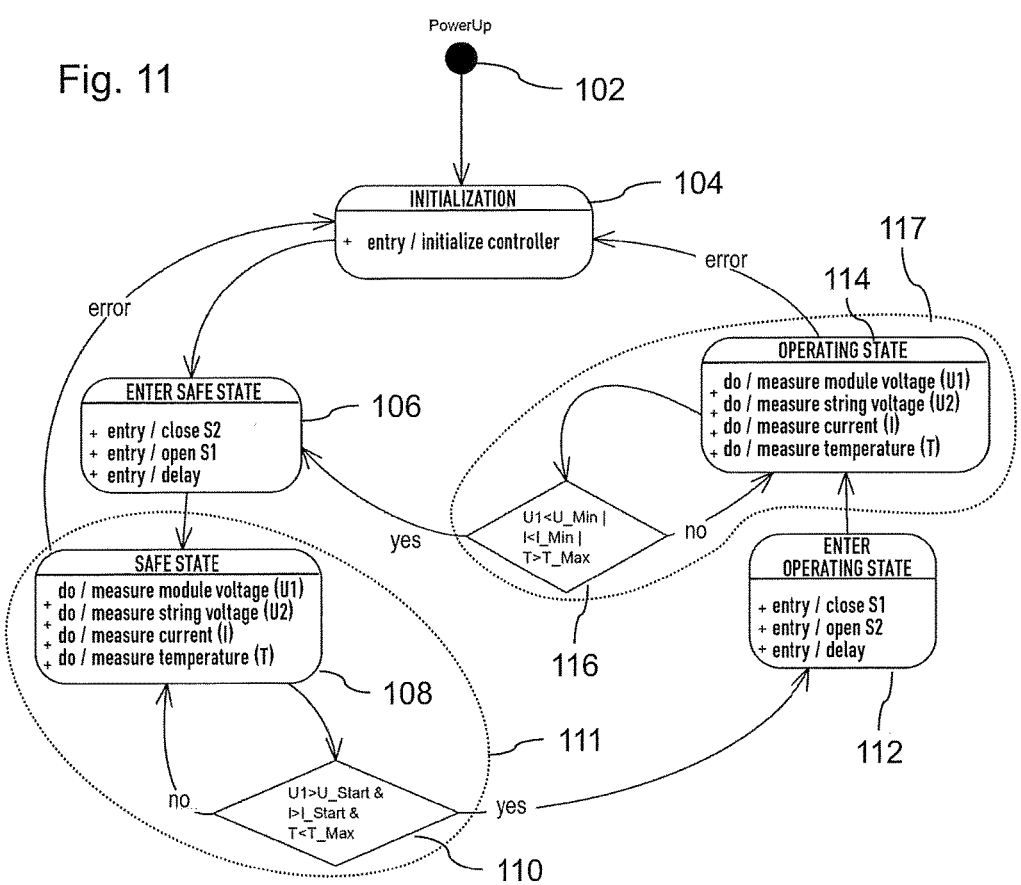
FIG. 11 is a flow chart illustrating the controlling of the safety circuit of the smart solar modules.

FIG. 11 shows an exemplary embodiment of a control algorithm for the smart solar junction boxes 12. After a "Power-up" 102, microcontroller 40 is initialized in a start step 104. Then, the safe state is again ensured in a step 106 by entries for closing the short-circuiting switch 52 and for opening the isolating switch 51. Then a short delay follows. In step 108, module voltage U1, string voltage U2, the current at sensor 68, and the temperature at temperature sensor 94 are measured. A test step 110 checks whether the module voltage U1 exceeds a threshold U_Start for starting and whether the current at sensor 68 exceeds a threshold I_Start and whether the temperature is below a certain threshold T_max. Unless all three criteria are met, smart solar junction box 12 remains within control loop 111 of the safe state which is defined by steps 108, 110.

When the three criteria of test step 110 are met, the microcontroller 40 closes the isolating switch 51, opens the short-circuiting switch 52, and again a certain delay follows.

In the operating state, step 114, module voltage U1, string voltage U2, string current I, and temperature T are again measured using sensors 36, 66, 68, 94. Test step 116 checks whether the module voltage U1 is below a threshold U_min, or whether the string current I is below a threshold I_Min, or whether the module temperature T is above a threshold T_max. If this OR operation gives a No, the smart solar junction box 12 remains in the control loop 117 of the operating state. Control loop 117 is defined by steps 114, 116. If one of the OR-ed conditions in step 116 is true, step 106 is executed again, i.e. the initiating of the safe state. Furthermore, error messages may be issued in the safe state 111 and in the operating state 117, which will again trigger initialization 104. Moreover, it can be seen that the operating state 117 and/or the safe state 111 include active control loops in which the measured values, e.g. the injected starting current or the start signal, the module voltage U1, the string voltage U2, and/or the temperature T are queried in order to trigger the switching operations in response to these values.

FIG. 12 illustrates an exemplary embodiment of a control algorithm of the starter circuit 71 with measuring device 75 and evaluation means 77. In a first step 132, the voltage increases from a night voltage or non-operating voltage to a minimum voltage level 134. The minimum voltage level 134 is provided by the current source 82 such as the power supply unit 83a or 83b, for example, or by non-smart solar module 30a. In the case that the minimum voltage level 134 is provided by a power supply unit 83a, 83b, an irradiation sensor 78 may provide the information whether in principle sufficient sunlight is available for operation of the system, so that the power supply unit 83a, 83b will not operate at night. If one or more non-smart solar module(s) 30a are used to supply the minimum voltage level 134, they will automatically provide this voltage as soon as sufficient light is illuminated. When the minimum voltage level 134 is present at the starter circuit, the starter circuit is supplied with electric power and starts operation in step 136. In step 138, measuring device 75 acquires the voltage in string 20 or in the photovoltaic system 1 as a first measured data profile 6. In step 141 the first measured data profile 6 is evaluated by evaluation means 77, and if in decision step 142 it is assessed to be non-critical 142a, the most recently stored system state 58 is read out from state memory 60 in step 144. If the system state 58 stored is a state which allows operation of the system (step 146a), such as for example the operating state 58a or safe state 58b, the starter circuit 71 begins to issue the start signal or the starting current, at step 148. The solar modules 30 will detect the start signal or starting current as described above with reference to FIG. 11, and will supply their power to the inverter 90. Evaluation means 77 then executes the control loop 140 until either a critical measured data profile 142b is detected or normal overnight shutoff takes place. Both a critical profile 142b and normal overnight shutoff or any other normal shutoff will lead to exiting from control loop 140. Typically, when the minimum voltage level is reached this will also lead to exiting from control loop 140, and the starter circuit is adapted to distinguish between different detected measured data profiles. This will be explained in more detail below.

Figure 17:
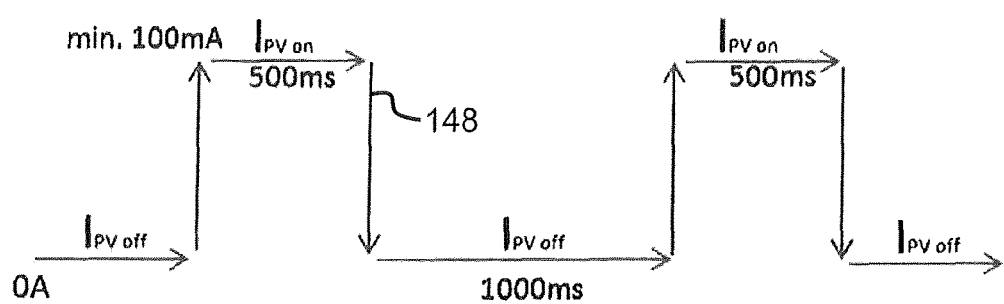
FIG. 17 shows an embodiment of a start signal.

In case that the state memory 60 already holds the error state 58c (step 146c), or in case that a critical profile 142b results in detection of an error state 58c, further execution of control loop 140 is not necessary. Two options for aborting control loop 140 are available and can be chosen. On the one hand, the error state 58c can immediately be written into the state memory, in step 149. Optionally, the starter circuit then terminates operation, in step 149a. That means, the photovoltaic system 1 cannot be readily switched on again, or only by skilled personnel. This is desirable under certain conditions, because some safety regulations for the operation of photovoltaic systems 1 require that a system restart is effected by skilled personnel only. Compliance with this requirement is made possible with the presented starter circuit 71. According to a further option, the starter circuit remains active and returns to control loop 140 before or after the writing into the state memory in step 149. Based on the acquisition of the first measured data profile, 138, an external start pulse that may be applied to the string line by an operator may possibly be detected by the evaluation means in step 147 and may be identified as a restart signal 147. Subsequently, the photovoltaic system 1 or the string 20 may resume operation. An example of a start pulse 147 is shown in FIG. 17.

FIG. 13 shows, in the upper part, a typical first measured data profile 6 as it may be acquired during a measurement of the string voltage or system voltage using a measuring device 75, in the present case a voltage sensor 74 (see e.g. FIG. 5). Prior to a start-up of photovoltaic system 1, an increase in the measured value to a minimum value 134 is detected, 132. Thus, the voltage rises from the night voltage or non-operating voltage, in this case 0 volts, to a minimum voltage level 134, in this case 30 volts. Since most solar modules 30 are smart solar modules 30, the string voltage will not exhibit a different profile in case of a start-up using existing sunlight irradiation instead of minimum level 134. Although in this case the increase observed will possibly not be from 0 V to 30 V, the voltage present in the string will be in a range that is in particular non-hazardous upon contact and far below the normal operating voltage of string 20 and photovoltaic system 1.

The minimum voltage level 134 is for example provided by power source 82, such as power supply unit 83a or 83b, or by the non-smart solar module 30a. In case the minimum voltage level 134 is provided by a power supply 83a, 83b, a light sensor 78 may provide information on whether in principle sufficient sunlight is available for operating the system, so that power supply unit 83a, 83b need not be operated at night. If one or more non-smart solar module(s) 30a are used to provide the minimum voltage level 134, they will automatically provide the voltage as soon as sufficient light is irradiated. When the minimum voltage level 134 is present at the starter circuit, the starter circuit is powered and starts operating. As described above, the measured data profile is evaluated (step 141, see FIG. 12) and the state memory is read out (step 144). If the state of the system is OK, the start signal for solar modules 30 is issued (step 148). In response thereto the safety circuits 13 will switch on the solar modules 30, i.e. electrically connect them to the respective string 20, and the string voltage or system voltage will rise to the operating voltage 6a. Optionally, the operating voltage 6a is adjusted to the most appropriate voltage in terms of maximum power output by the maximum power point tracker (MPPT), so that the voltage may vary in the range of operating voltage 6a. However, the operating voltage 6a will be significantly different from the minimum voltage level, e.g. operating voltage 6a is about 1000 V.

The operating voltage 6a is maintained by solar modules 30 until the solar modules 30 are switched off. When the solar modules 30 are switched off, the string or system voltage drops back to the minimum value as provided by current source 82, for example. Upon shutdown of the solar modules 30 the operating voltage 6a typically breaks down rapidly, so that a jump discontinuity 9 occurs in the first measured data profile 6.

In a very simple case, the starter circuit 71 simply continues to issue the start signal until the voltage gradually falls below the minimum voltage, either because power supply unit 83a, 83b is turned off in response to light sensor 78 or because the non-smart solar module(s) 30a do no longer provide any voltage. The state memory continues to hold the "non-critical" state 58a, so the next day the photovoltaic system 1 can restart normal operation.

However, the starter circuit 71 presented moreover permits to evaluate more complex measured data profiles, in particular to evaluate two simultaneously acquired measured data profiles in combination and to identify therefrom whether the measured data profile corresponds to a fault or to a normal profile such as upon switching off at sunset.

In the lower part, FIG. 13 illustrates a second measured data profile 8 which was acquired at the same time as the first measured data profile 6. Shown is a current profile of a typical operating current 8a. For acquiring operating current 8a, a measuring device 75 is used, in the present case current sensor 76. A minimum current comparable to the minimum voltage 134 is not suggested. The current in string 20 or in the photovoltaic system 1 (depending on whether the string current or system current is measured) is below a current threshold, for example the string current (or system current) is close to zero or less than 150 milliamps (mA).

The system current remains below the threshold value when the minimum voltage level is reached (step 134) and when the starter circuit starts operation (step 136). Only when the start signal is issued (step 148) and the solar modules 30 start operation controlled by safety circuits 71, an appreciable current, the operating current 8a, will flow through the string to the inverter 90. Optionally, the current is controlled to a maximum by an MPPT. In the course of the day, towards evening or generally at nightfall, the operating current 8a gradually decreases until it reaches the current threshold or falls below. The gradual, i.e. slow decrease of measured data profile 8, or more precisely in mathematical terms the small negative slope of measured data function 8 can be interpreted by evaluation device 77 as a signal for a normal course of a sunset during which the safety circuits 13 gradually switch off the respectively associated smart solar modules 30. On the other hand, the dropping below the current threshold may be used as a signal as well. If operating voltage 6a and operating current 8a are jointly evaluated (step 141), features or parameter conditions may be defined for the first and second measured data functions 6, 8, for example, that must be met in order to detect a normal system shutdown as "safe" or "non-critical".

For example, a parameter condition for the first measured data function 6 may be a "jump" by −50% in the function value at jump discontinuity 9. In other words, at a discontinuity point 9 of the function the absolute value of the function value of measured data function 6 is at least halved within a predefined time interval 10, e.g. within 5, 10 or 15 seconds. Another parameter condition for the first measured data function may be a change in the absolute value at jump point 9, for example a minimum change, specifically a minimum decrease of the operating voltage 6a by 40 volts within time interval 10. Yet another parameter condition for the first measured data function may be the reaching of a minimum voltage level 134 which should remain at more than 20 V after the jump discontinuity, for example. Preferably, all three parameter conditions should be met in total.

Simultaneously with the parameter conditions for the first measured data function 6, i.e. in the same predefined time interval 10, parameter conditions may have to be met by the second measured data function 8 so that the starter circuit 71 identifies a "normal shutdown". By simultaneously acquiring and evaluating the second measured data function 8, the reliability of the identification of the evaluation means 77 and thus of the entire photovoltaic system 1 is increased. A parameter condition for the second measured data function 8 may be that after jump discontinuity 9 the operating current 8a is below the current threshold, i.e. at a value of 0±5 mA, for example.

The evaluation device 77 is able, solely on the basis of parameter conditions or features such as those listed above but not exclusively, to identify and distinguish whether a normal system shutdown 146a is going on or an error event 58c occurs. Fault detection rate is increased, and what is also of great importance for an operator of a photovoltaic system 1, erroneous detection of faults is further reduced, so that the photovoltaic system 1 can be available for generating electricity for an extended period. The length of time interval 10 may be selected so as to enable optimal detection of measured data profile 6, 8 on the one hand, so that false positives are avoided. On the other hand, the length of time interval 10 may be defined by a standard, as common nowadays with photovoltaic systems, so that an optimal detection is selected within a predetermined period of time. A time interval 10 of about up to 15 seconds is preferred because the power output of the photovoltaic system 1 in this period of time is relatively limited and is manageable for standard electrical connectors and insulators. Shortening of the time interval 10 would increase the requirements on evaluation means 77 for reliably detecting errors. An extension of the time interval 10 on the other hand would increase the requirements on the rest of the electrical components to "endure" an error for an extended time.

Optionally, the starter circuit 71 may store the shutdown of smart solar modules 30 shown in FIG. 13 and reliably identified as going to the safe state 58b, in state memory 60, so that at the next start-up, for instance the next morning, the starter circuit 71 will be aware of the safe shutdown of the photovoltaic system 13 the previous day. This information may also be provided for further evaluation purposes, for example via interface 84. In principle, however, the starter circuit may rely on the two states operating state 58a and error state 58c to allow reliable identification of faults.

Another example of identifiable first and second measured data or parameter profiles 6, 8 is shown in FIG. 14. The upper part of the figure shows a voltage profile over time. Until reaching the operating voltage 6a and adjusting the operating voltage by means of the MPPT the profile corresponds to that of FIG. 13. Then, however, at the beginning of time interval 10, e.g. 5, 10 or 15 seconds, a first jump discontinuity 9a can be seen at which the measured data profile 6 increases suddenly, for example to an open circuit voltage. Within time interval 10, the absolute value finally drops, by a great amount, to the minimum voltage level 134.

The second measured data profile 8 shown in the lower part of FIG. 14 is again a current profile which is similar to that of FIG. 13 until the operating current 8a is reached. The illustrated waveforms of voltage and current in string 20 of the photovoltaic system 1 exemplify a disconnection of the inverter 90 from the power line of the photovoltaic system 1 when the safety circuits 13 have not switched the smart solar modules 30 to the safe state yet. When the inverter 90 is disconnected at the first jump point 9a, the solar modules 30 are no longer "under load" so that the voltage initially rises with a jump to the open circuit voltage. At the second jump point 9b, the solar system can eventually be shut down safely by bringing the solar modules 30 to the safe state 58b by means of the safety circuit.

As a first parameter condition for detecting the illustrated disconnection of the inverter, a voltage change is identified in the first measure data profile 6 at the first jump discontinuity 9a by about or at least +10%. In other words, at a first jump point 9a the first measured data profile increases by at least 1/10 of the absolute value within a predefined time interval 10. Within the predefined time interval 10, e.g. 10 or 15 seconds, the absolute value of the function value of the first measured data profile 6 at least halves at a second jump discontinuity 9b of the function. Another possible parameter condition for the first measured data function is a change of the absolute value of the operating voltage 6a at jump discontinuity 9b by 40 volts or more within the same predefined time interval 10. Yet another possible parameter condition for the first measured data function 6 in the embodiment of FIG. 14 is the reaching of or lowering to a minimum voltage level 134, e.g. 30 volts, or to at least 20 volts as an absolute value.

A possible parameter condition for the second measured data function 8 at the first jump discontinuity 9a is an absolute value of the operating current 8a of less than 150 mA. In other words, a parameter condition for the second measured data function 8 can be that the measured operating current 8a is below the predefined current threshold. At the same time or approximately the same time with the change in the first measured data function 6 at the first jump discontinuity 9a (depending on the measurement resolution, e.g. sampling rate of the measuring system used, inter alia), the second measured data function 8 jumps to a very small value, e.g. to 0±5 mA, for the sake of simplicity.

In the exemplary case of FIG. 14, a disconnection of the inverter 90 can be identified on the basis of these parameter conditions and can be distinguished from an error with increased reliability.

Figure 15:
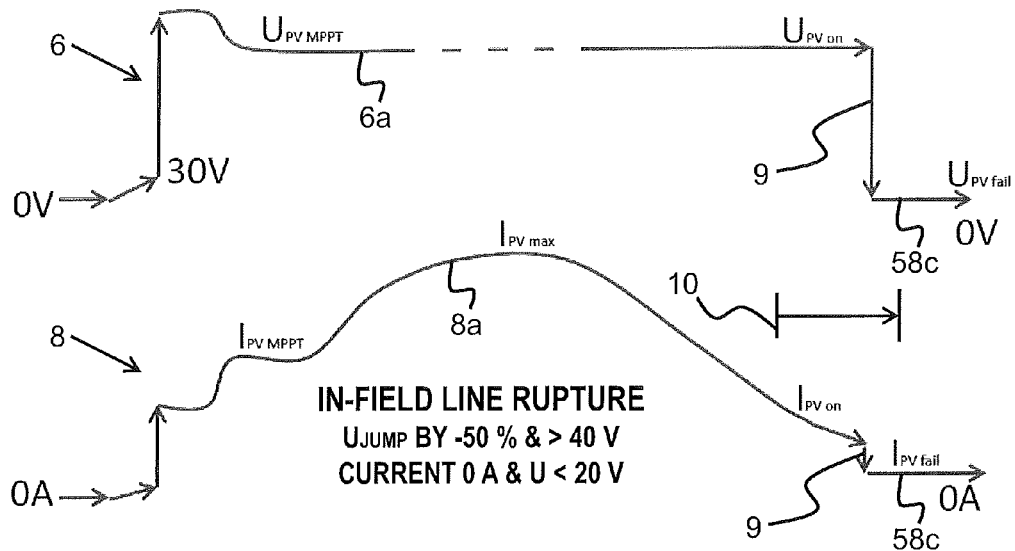
FIG. 15 shows a graph of exemplary voltage and current profiles in case of a fault.

FIG. 15 shows the detection of a first fault. The first measured data profile 6 illustrated in the upper part of FIG. 15 corresponds to that of FIG. 13 until the operating voltage 6a is reached. At a discontinuity point 9 of measured data function 6, the absolute value of the function value of measured data function 6 at least halves within a predefined time interval 10, e.g. within 10 or 15 seconds. Another parameter condition for the first measured data function is a great change of the absolute value of the operating voltage 6a at jump discontinuity 9 by at least 40 volts within the predefined time interval 10. Yet another parameter condition for the first measured data function 6 is a decrease of the absolute value of the first measured data function 6 below the minimum voltage level 134 within the predefined time interval 10, i.e. in particular after the jump discontinuity, to less than 20 V.

The second measured data function 8 shown in the lower part of FIG. 15 corresponds to that of FIG. 13 until the operating current 8a is reached. At jump discontinuity 9, the current decreases to an absolute value below the current threshold, i.e. to 0±5 mA, for example, within the predefined time interval 10.

The example of FIG. 15 illustrates an error situation which may for instance be a line rupture in the system array, more generally a short circuit. The voltage value which is normally maintained at the minimum voltage level 134 by power source 82, drops below the minimum voltage level 134, which is identified as a parameter condition or feature indicating a short circuit. In state memory 60, the system state is set to error state 58c. Now the system will remain in the deactivated state, i.e. at substantially zero voltage, and will not restart operation on its own, since it must be assumed that the cause of the fault has to be eliminated first.

Possibly, in this way, intervention of operating personnel may be required after the occurrence of a fault and setting of the error state 58c. The intervention of operating personnel, i.e. of a skilled person for restarting the system after a fault can further increase the safety of system operation, since in this way the system may first be checked by skilled personnel before it is reconnected to the power grid. Under certain circumstances, this intervention by operating personnel after a fault may even be a mandatory requirement, so that even in case of such a restarting by skilled personnel in compliance with some standard or law the presented starter circuit 71 with error identification provides the required measures to prevent unauthorized restarting of the photovoltaic system 1.

Figure 16:
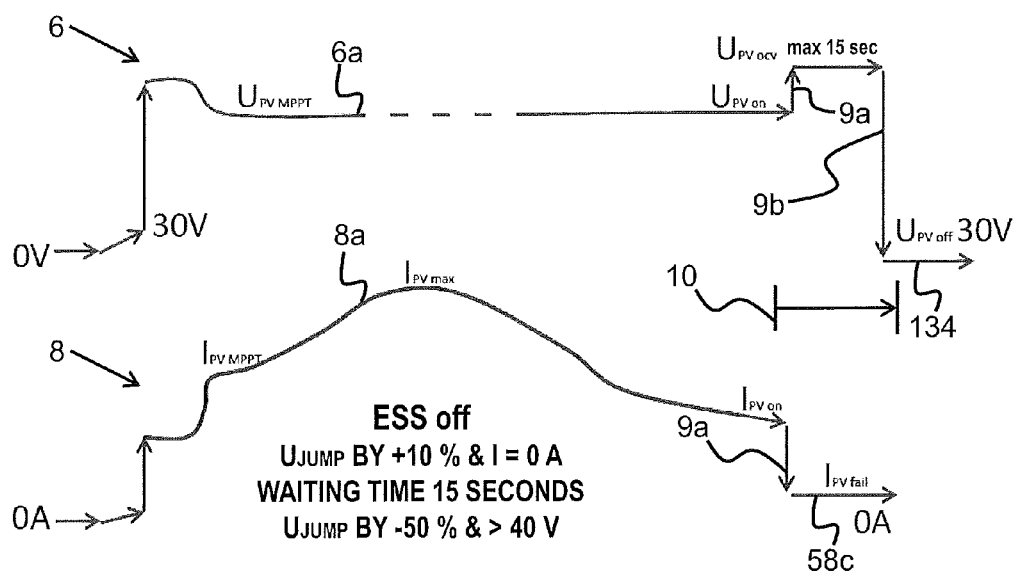
FIG. 16 shows another exemplary graph of voltage and current profiles in case of a fault.

FIG. 16 shows another error case. The first measured data profile shown in the upper part of FIG. 6 is again identical to that of FIG. 13 until the operating voltage 6a is reached. In a predefined time interval 10 the absolute value of measured data function 6 now increases at a first jump discontinuity 9a, for example by 1/10 of the absolute value or more, in particular to the open-circuit voltage, remains increased for a short period, 9 seconds in this example, and then within the predefined time interval 10 finally falls by at least half, at the same time by at least 40 volts of the absolute value at the second jump discontinuity 9b. In other words, the function value at least halves at the second discontinuity point 9b. At the same time, the second function profile 8 (which corresponds to that of FIG. 13 until the operating current 8 is reached) drops at the first jump discontinuity 9a to below the current threshold i.e. to 0±5 mA, for example, within the predefined time interval 10. The error case shown by way of example in FIG. 16 corresponds to measured data profiles observed in case of a line rupture in a region in front of or upstream of the inverter 90 but downstream the solar modules 30, for example. However, the error shown in FIG. 16 corresponds as well to the case that the electronic solar switch (ESS) is actuated, for example by firemen. This is no normal operation either but should be treated as an error case.

FIG. 17 shows an example of a start signal or start pulse 148. In intervals of 1000 ms current pulses 148 of a height of at least 100 mA and a duration of about 500 ms are injected into the string line. This signal may for instance be continuously injected into the voltage-carrying string line as a start signal or starting current in the operating state 58a of the system, so that the safety circuits 13 only enable the associated solar module 30 to supply power in presence of the start signal or starting current. On the other hand, the signal shown in FIG. 17 may be used to re-enable the photovoltaic system 1 for normal operation after a fault, by causing that the operating state 58a is set in state memory 60.

The process described allows for a simplified configuration of the measuring device in that a voltage measurement in a small range as compared to the operating voltage 6a may suffice, for example in a range from 0 to 120 volts or 130 volts in case of an operating voltage 6a of about 1000 Volt. The voltage measurement range to be preferably covered comprises the minimum operating voltage of the employed inverter, and the minimum operating voltage is typically 120 volts. Error detection and hence the choice of the features or parameter conditions may even be further reduced to a range between 0 to 40 volts. At the same time, a current measurement is only needed in a small range significantly smaller than the operating current 8a, e.g. from 0 to 50 mA.

In summary, an invention is presented which provides a fault detection system in a photovoltaic system 1, which is able to detect the system state on the basis of a first and optionally a second measured data or parameter profile 6, 8 and is therefore able to distinguish between errors and the operating state of the system. This can further increase the yield of the system.

It will be apparent to those skilled in the art that the embodiments described above are meant to be exemplary and that the invention is not limited thereto but may be varied in many ways without departing from the scope of the claims. Furthermore it will be apparent that the features individually define components of the present disclosure, irrespective of whether they are disclosed in the description, the claims, the figures, or otherwise, even if they are described together with other features.

LIST OF REFERENCE NUMERALS

1 Photovoltaic system
6 First measured data profile
6 Operating voltage
8 Second measured data profile
8a Operating current
9 Jump discontinuity
10 Time interval
12 Solar Junction Box
12a Conventional solar junction box
12 Safety circuit
13 Junction box housing
14a-d Side wall of junction box housing
14e Cover
14f Bottom surface
14g Collar
16 Cable feedthrough
18 String line
20 String
22 Connection elements
24 Intermediate tap
30 Solar module
30a Non-smart solar module
32 Solar sub-module
34 Bypass diode
36 Voltage sensor
36a Link
40 Microcontroller
42 Power supply unit
42a Supply line
51 Isolating switch
52 Short-circuiting switch
53 Shunt switch
54 Isolating switch
55 Enable switch
58 System state
58a Operating state
58b Safe state
58c Error state
60 State memory
62 Connection elements
66 Voltage sensor
66a Link
68 Current sensor
68a Link
70 Start box
71 Starter circuit
72 Input terminal
73 Output terminal
74 Voltage sensor
74a Link
75 Measuring device
76 Current sensor
76a Link
77 Evaluation means
78 Irradiation sensor
78a Link
79 Timer
80 Controller
81 Capacitor
82 Current source
82a Diode
83a Power supply unit
83b Power supply unit
84 Interface
85 Power supply unit
85a Diode
86,88 Signaling means
90 Inverter, a.c. converter
91 Circuit
92 Input capacitor
102 Method step "power up"
104 Method step "start step"
106 Method step
108 Method step
110 Method step "evaluation step"
111 Control loop (safe state)
114 Operating state
116 Method step "evaluation step"
117 Control loop
132 First method step
134 Minimum voltage level
136 Start of starter circuit
138 Data acquisition
140 Control loop
141 Evaluation step
142 Decision step
142a Non-critical measured data profile
142b Critical measured data profile
144 Reading state memory
146a State check OK
146c State check not OK
148 Issue of start signal
149 Writing into state memory

The invention claimed is:

1. A method for detecting an electrical fault in a photovoltaic system, comprising the steps of:
measuring at least a first data profile of a first electrical parameter in the photovoltaic system, in particular in a string of the photovoltaic system;
evaluating the first measured data profile;
identifying a system state based on the first measured data profile;
storing the system state in a state memory;
retrieving the system state from the state memory; and
issuing an enable signal to solar modules of the photovoltaic system in response to the retrieved system state.

2. The method as claimed in claim 1, wherein the system state can assume at least two predefined states, namely an operating state or an error state.

3. The method as claimed in claim 1, further comprising the additional steps of:
measuring a second data profile of a second electrical parameter of the photovoltaic system, in particular of the string of the photovoltaic system;

synchronously evaluating the first and second measured data profiles;
identifying a system state based on a combination of the evaluation results of the first and second measured data profiles.

4. The method as claimed in claim 1,
wherein the first electrical parameter is a system voltage or a string voltage; and/or
wherein the second electrical parameter is a system current or a string current.

5. The method as claimed in claim 4, wherein the first measured data profile is raised to a minimum voltage level greater than zero.

6. The method as claimed in claim 1,
wherein the photovoltaic system comprises at least an inverter for producing an a.c. voltage from the d.c. voltage of the photovoltaic system; and
wherein the evaluating of the measured data profiles is performed below a minimum operating voltage of the inverter.

7. The method as claimed in claim 1, wherein
an enable signal is issued to solar modules of the photovoltaic system when the system state has assumed the operating state; and/or
no enable signal is issued to solar modules of the photovoltaic system when the system state has assumed the error state; and/or
wherein the solar module is electrically disconnected when no enable signal is detected.

8. The method as claimed in claim 1, wherein the system state can assume three predefined states, namely operating state, error state, and safe state.

9. The method as claimed in claim 1,
wherein the system state can assume three predefined states, namely operating state, error state, and safe state;
an enable signal is issued to solar modules of the photovoltaic system when the system state has assumed the safe state; and
wherein the state memory has a write protection, so that system states operating state and safe state can no longer be written once the error state is stored in the state memory as the system state.

10. A photovoltaic system comprising at least one string of series-connected solar modules for generating electric power from solar energy, in particular adapted for carrying out a method as claimed in claim 1, comprising:
a plurality of solar modules each comprising a solar junction box;
a measuring device for measuring a first data profile of a first electrical parameter in the photovoltaic system, in particular in said string;
evaluation means for evaluating the first measured data profile and for identifying a system state based on the first measured data profile;
a state memory for storing the system state; and,
a starter circuit connected to the string line, which reads out the state memory holding the system state and which is adapted to inject a starting current or a start signal into the string line in response to the system state.

11. The photovoltaic system as claimed in claim 10, wherein the state memory is a flash memory which retains the stored system state even in the event of a power supply failure.

12. The photovoltaic system as claimed in claim 10,
wherein the evaluation means comprises a microcontroller; and/or
wherein the evaluation means is responsive to a voltage sensor and/or a current sensor to identify the system state and to store the system state in the state memory.

13. The photovoltaic system as claimed in claim 12,
wherein the microcontroller comprises a comparison memory;
wherein the comparison memory holds predefined data profiles for the operating state and the error state; and
wherein the microcontroller compares the measured data profiles with the predefined data profiles to identify the system state.

14. The photovoltaic system as claimed in claim 10,
wherein the measuring device is further adapted for measuring a second data profile of a second electrical parameter of the photovoltaic system, in particular of the string of the photovoltaic system;
wherein the evaluation means is further adapted for synchronously evaluating the first and second measured data profiles and for identifying the system state on the basis of a combination of the evaluation results of the first and second measured data profiles.

15. The photovoltaic system as claimed in claim 10,
wherein the system state can assume three predefined states, namely operating state, error state, and safe state; and
wherein the state memory comprises a write protection so that the state memory can no longer be written, which write protection is automatically activated as soon as the error state is stored in the state memory.

16. The photovoltaic system as claimed in claim 15,
wherein the write protection can be reset or deleted by manual actuation of an enable switch or by remote-controlled starting of a starter circuit by sending a start signal to an interface of the starter circuit by skilled personnel, so that the photovoltaic system is again available for generating electric power.

17. The photovoltaic system as claimed in claim 10,
wherein at least one of the solar modules has a safety circuit that is responsive to the starting current or start signal to enable the solar module to feed generated solar power through the solar junction box via a string line, or is responsive to an absence of the starting current or start signal injected into the string line to disconnect the solar module from the photovoltaic system.

18. The photovoltaic system as claimed in claim 17, wherein in the safe state or in the error state the safety circuit is powered by the associated solar module when the associated solar module is irradiated by light, so that the safety circuit is able to switch from the safe state or the error state to the operating state.

19. The photovoltaic system as claimed in claim 10, wherein the measuring device and the evaluation means are part of the starter circuit and wherein the starter circuit is accommodated in a start box connected to the string separately from the solar modules.

20. The photovoltaic system as claimed in claim 10,
wherein the first measured data profile is a voltage profile; and
wherein the evaluation means is powered by a power source, in particular a non-smart solar module or a power supply unit, to raise the voltage profile to a minimum value greater than zero.

21. The photovoltaic system as claimed in claim 10, wherein the safety circuit comprises a current sensor which measures or detects the starting current injected by the starter circuit into the string line in order to automatically switch the safety circuit from the safe state or the error state to the operating state, and vice versa, in response to the measurement result.

22. The photovoltaic system as claimed in claim 10,
wherein the safety circuit is adapted to automatically switch from the operating state to the safe state when the associated solar module is shadowed or in case of general darkness and the associated drop of module voltage; and/or
wherein the evaluation means is adapted to automatically switch from the operating state to the safe state when the voltage falls below a minimum operating voltage so causing a normal shutdown of the inverter in case a large area is shadowed or in case of general darkness, so that no starting current or start signal is transmitted to the solar modules any longer.

23. The photovoltaic system as claimed in claim 10, wherein the starter circuit comprises at least a first switch by means of which an electrical circuit in the string can be closed to start the string.

24. The photovoltaic system as claimed in claim 10, wherein the starter circuit comprises a current source which supplies the starting current or the start signal injected into the string line.

25. The photovoltaic system as claimed in claim 10, wherein the starter circuit comprises a controller having an interface and/or an external enable switch, and wherein the controller is responsive to an activation signal at the interface and/or is responsive to an actuation of the enable switch and/or is responsive to a signal of an irradiation sensor and/or is responsive to a timer, to control the injection of the starting current into the string line.

26. The photovoltaic system as claimed in claim 25, wherein the controller has at least one signal output which signals the safe state, the operating state, and/or an error state.

27. A start box, comprising a starter circuit adapted for being connected to the string line of a photovoltaic system as claimed in claim 10, and for injecting the starting current into the string line in response to the system state stored in the state memory to cause the safety circuit to switch from the safe state to the operating state, and to cause writing the system state into the state memory.

* * * * *